(12) United States Patent　　(10) Patent No.: US 8,053,332 B2
Noda　　(45) Date of Patent: Nov. 8, 2011

(54) METHOD FOR MANUFACTURING SOI SUBSTRATE AND SEMICONDUCTOR DEVICE

(75) Inventor: Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/684,269

(22) Filed: Jan. 8, 2010

(65) Prior Publication Data

US 2010/0184269 A1　　Jul. 22, 2010

(30) Foreign Application Priority Data

Jan. 21, 2009　　(JP) .................................. 2009-011425

(51) Int. Cl.
*H01L 21/30*　　(2006.01)
*H01L 21/46*　　(2006.01)
(52) U.S. Cl. . 438/458; 438/455; 438/459; 257/E21.545; 257/E21.561
(58) Field of Classification Search .................. 438/406, 438/455, 458, 459; 257/E21.545, E21.561
See application file for complete search history.

(56) References Cited

U.S. PATENT DOCUMENTS

| 5,968,847 | A * | 10/1999 | Ye et al. ......................... | 438/734 |
| 6,140,210 | A | 10/2000 | Aga et al. | |
| 6,423,644 | B1 * | 7/2002 | Nallan et al. ................... | 438/714 |
| 2008/0246109 | A1 * | 10/2008 | Ohnuma et al. ............... | 257/507 |
| 2009/0098709 | A1 * | 4/2009 | Ohnuma et al. ............... | 438/458 |
| 2009/0117707 | A1 * | 5/2009 | Shimomura et al. .......... | 438/458 |
| 2009/0137101 | A1 * | 5/2009 | Yamazaki et al. ............. | 438/479 |

(Continued)

FOREIGN PATENT DOCUMENTS

EP　　0905767　　3/1999

(Continued)

OTHER PUBLICATIONS

Kurozaki et al. "Evaluation of plasma etching damange in Si surface by UV-Raman spectroscopy" JSPS Si Symposium (2008).*

(Continued)

*Primary Examiner* — Walter L Lindsay, Jr.
*Assistant Examiner* — Leonard Chang
(74) *Attorney, Agent, or Firm* — Eric J. Robinson; Robinson Intellectual Property Law Office, P.C.

(57) ABSTRACT

To provide a method for manufacturing a semiconductor substrate provided with a single crystal semiconductor layer which can be used practically even when a substrate with a low upper temperature limit, such as a glass substrate, is used. An oxide film is formed on a single crystal semiconductor substrate; accelerated ions are introduced into the single crystal semiconductor substrate through the oxide film to form an embrittled region in the single crystal semiconductor substrate; a supporting substrate is bonded such that the supporting substrate and the single crystal semiconductor substrate face each other with the oxide film interposed therebetween; separation is performed at the embrittled region into the supporting substrate to which a single crystal semiconductor layer is bonded and part of the single crystal semiconductor substrate by heating of the single crystal semiconductor substrate; first etching is performed on a surface of the single crystal semiconductor layer bonded to the supporting substrate with a substrate bias applied; the single crystal semiconductor layer is irradiated with a laser beam and at least part of the surface of the single crystal semiconductor layer is melted and solidified; and second etching is performed on the surface of the single crystal semiconductor layer with no substrate bias applied.

12 Claims, 20 Drawing Sheets

U.S. PATENT DOCUMENTS

2009/0170287 A1* 7/2009 Endo et al. .................... 438/458

FOREIGN PATENT DOCUMENTS

| EP | 1045448 | 10/2000 |
| JP | 11-102848 A | 4/1999 |
| JP | 11-163363 A | 6/1999 |
| JP | 2000-124092 A | 4/2000 |

OTHER PUBLICATIONS

Bosseboeuf et al. "Planarization of rough silicon surfaces by laser annealing" Applied Surface Science 109/110 (1997) 473-476.*

* cited by examiner

FIG. 1A-1
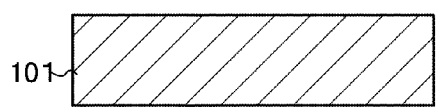
FIG. 1B-1
FIG. 1A-2
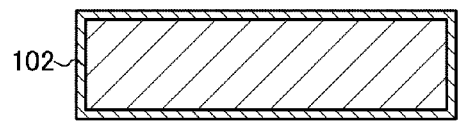
FIG. 1A-3
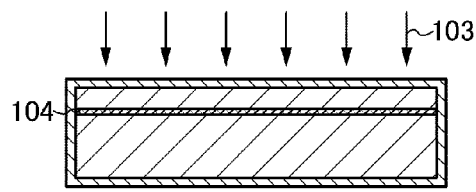
FIG. 1C
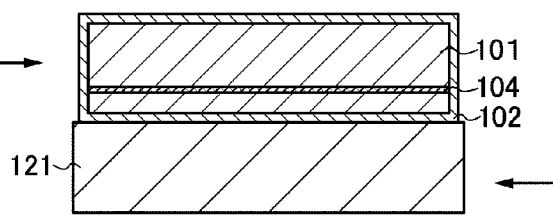
FIG. 1D
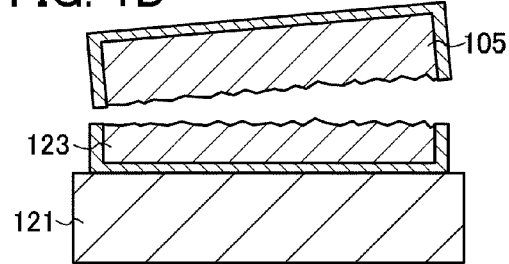

CVD-CVD

Dry-CVD

CVD-Dry

Dry-Dry

METHOD FOR MANUFACTURING SOI SUBSTRATE AND SEMICONDUCTOR DEVICE

BACKGROUND OF THE INVENTION

1. Field of the Invention

The present invention relates to a method for manufacturing a silicon-on-insulator (SOI) substrate having a so-called SOI structure in which a single crystal semiconductor layer is provided on an insulating surface, and a method for manufacturing a semiconductor device having the SOI structure.

2. Description of the Related Art

Integrated circuits have been developed, in which a semiconductor substrate called a silicon-on-insulator (hereinafter also referred to as "SOI") having a thin single crystal semiconductor layer on an insulating surface is used instead of a silicon wafer manufactured in such a manner that an ingot of a single crystal semiconductor is thinly sliced. The integrated circuit using an SOI substrate has attracted attention as an integrated circuit which reduces parasitic capacitance between a drain of a transistor and the substrate and improves the performance of a semiconductor integrated circuit.

As a method for manufacturing SOI substrates, a hydrogen ion implantation separation method is known (e.g., see Patent Document 1). The hydrogen ion implantation separation method is a method in which hydrogen ions are implanted into a silicon wafer to form an embrittled region at a predetermined depth from a surface of the silicon wafer, and the silicon wafer is separated at the embrittled region, whereby a thin silicon layer is bonded to another silicon wafer. In addition to the heat treatment for separation of a silicon layer, it is necessary to perform heat treatment in an oxidizing atmosphere to form an oxide film over the silicon layer, remove the oxide film, and perform heat treatment at 1000° C. to 1300° C. to increase bonding strength.

On the other hand, a semiconductor device in which an insulating substrate made of high heat resistance glass or the like is provided with a silicon layer is disclosed (e.g., see Patent Document 2). In this semiconductor device, an entire surface of crystallized glass whose strain point is greater than or equal to 750° C. is protected by an insulating silicon film, and a silicon layer obtained by a hydrogen ion implantation separation method is bonded to the insulating silicon film.

On the surface of the silicon layer obtained by a hydrogen ion implantation separation method, there exists defects due to an ion implantation step or the like for forming an embrittled region. Therefore, a technique of removing the defects by vapor-phase etching is disclosed (see Patent Document 3).

[Reference]
[Patent Document]
[Patent Document 1] Japanese Published Patent Application No. 2000-124092
[Patent Document 2] Japanese Published Patent Application No. H11-163363
[Patent Document 3] Japanese Published Patent Application No. H11-102848

SUMMARY OF THE INVENTION

However, there is a possibility that metallic contamination is attached to and diffused into the silicon layer in removing the defects by vapor-phase etching. In addition, there is a possibility that the metallic contamination remains in the silicon layer when a semiconductor element is formed over the SOI substrate. The metallic contamination causes decrease in performance and reliability of a semiconductor device.

In view of the foregoing problem, an object of an embodiment of the present invention is to provide an SOI substrate in which contamination due to impurities such as a metal element and the like is suppressed. In addition, another object of an embodiment of the present invention is to prevent decrease in performance and reliability of a semiconductor device formed using such an SOI substrate.

An embodiment of the present invention is a method for manufacturing an SOI substrate including the steps of: forming an oxide film on a single crystal semiconductor substrate; introducing accelerated ions into the single crystal semiconductor substrate through the oxide film to form an embrittled region in the single crystal semiconductor substrate; bonding a supporting substrate such that the supporting substrate and the single crystal semiconductor substrate face each other with the oxide film interposed therebetween; performing separation at the embrittled region into the supporting substrate to which a single crystal semiconductor layer is bonded and part of the single crystal semiconductor substrate by heating of the single crystal semiconductor substrate; performing first etching on a surface of the single crystal semiconductor layer bonded to the supporting substrate with a substrate bias applied; irradiating the single crystal semiconductor layer with a laser beam and melting and solidifying at least part of the surface of the single crystal semiconductor layer; performing second etching on the surface of the single crystal semiconductor layer with no substrate bias applied.

Another embodiment of the present invention is a method for manufacturing an SOI substrate including the steps of: forming an oxide film on a single crystal semiconductor substrate; introducing accelerated ions into the single crystal semiconductor substrate through the oxide film to form an embrittled region in the single crystal semiconductor substrate; bonding a supporting substrate such that the supporting substrate and the single crystal semiconductor substrate face each other with the oxide film interposed therebetween; performing separation at the embrittled region into the supporting substrate to which a single crystal semiconductor layer is bonded and part of the single crystal semiconductor substrate by heating of the single crystal semiconductor substrate; performing first etching on a surface of the single crystal semiconductor layer bonded to the supporting substrate with no substrate bias applied; irradiating the single crystal semiconductor layer with a laser beam and melting and solidifying at least part of the surface of the single crystal semiconductor layer; performing second etching on the surface of the single crystal semiconductor layer with no substrate bias applied.

Further, in an embodiment of the present invention, the first etching is preferably performed using a chlorine-based gas. The second etching is preferably performed using a fluorine-based gas.

Alternatively, in an embodiment of the present invention, the first etching and the second etching are preferably performed using a fluorine-based gas.

In an embodiment of the present invention, a glass substrate can be used as a supporting substrate.

In this specification, the single crystal means a crystal in which, when a certain crystal axis is focused, the direction of the crystal axis is oriented in the same direction in any portion of a sample and which has no crystal grain boundary between crystals. Note that in this specification, the single crystal includes a crystal in which the direction of crystal axes is uniform as described above and which has no grain boundaries even when it includes a crystal defect or a dangling bond. In addition, re-single-crystallization of a single crystal semiconductor layer means that a single crystal semiconductor layer having a single crystal structure returns to a single crystal structure after being in a different state from the single crystal structure (e.g., a liquid-phase state). In addition, it can also be said that re-single-crystallization of a single crystal semiconductor layer means that a single crystal semiconductor layer is recrystallized to form a single crystal semiconductor layer.

The term "semiconductor device" in this specification refers to devices in general that can operate by utilizing semiconductor characteristics, and display devices, semiconductor circuits, and electronic devices are included in the category of the semiconductor device.

Furthermore, the term "display device" in this specification includes a light-emitting device and a liquid crystal display device in its category. A light-emitting element includes, in its scope, an element whose luminance is controlled by current or voltage, and specifically includes an inorganic electroluminescent (EL) element, an organic EL element, and the like.

According to an embodiment of the present invention, an SOI substrate in which contamination of a single crystal semiconductor layer due to impurities such as a metal element and the like is suppressed can be manufactured. Further, decrease in performance and reliability of a semiconductor device formed using such an SOI substrate can be prevented.

BRIEF DESCRIPTION OF THE DRAWINGS

In the accompanying drawings:

FIGS. 1A-1 to 1D are views illustrating a method for manufacturing an SOI substrate according to an embodiment of the present invention;

FIGS. 4A-1 to 4D are views illustrating a method for manufacturing an SDI substrate according to an embodiment of the present invention;

DETAILED DESCRIPTION OF THE INVENTION

Figure 2A:
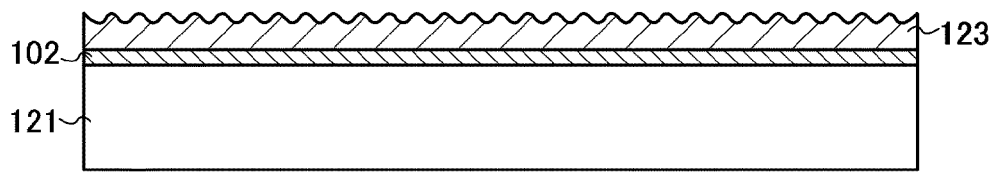
FIGS. 2A to 2E are views illustrating a method for manufacturing an SOI substrate according to an embodiment of the present invention.

Hereinafter, embodiments and examples of the present invention will be described in detail with reference to the accompanying drawings. Note that it is easily understood by those skilled in the art that the present invention is not limited to the description below and that a variety of changes can be made in forms and details without departing from the spirit and the scope of the present invention. Therefore, the present invention should not be construed as being limited to the description of the embodiment modes to be given below. Note that, in the structures of the present invention described below, like portions or portions having similar functions are denoted by common reference numerals in different drawings, and description of them will not be repeated.

Embodiment 1

In this embodiment, a method for manufacturing an SOI substrate according to an embodiment of the present invention will be described with reference to the drawings.

Figures 1, 4A:
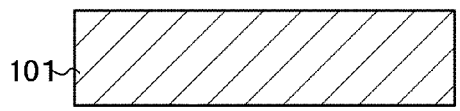

First, a semiconductor substrate 101 is prepared (see FIG. 1A-1).

As the semiconductor substrate 101, a single crystal semiconductor substrate or a polycrystalline semiconductor substrate can be used, and examples thereof include a single crystal silicon substrate, a polycrystalline silicon substrate, a germanium substrate, compound semiconductor substrates of gallium arsenide, indium phosphide, and the like. Typical examples of commercially available silicon substrates are circular silicon substrates which are 5 inches (125 mm) in diameter, 6 inches (150 mm) in diameter, 8 inches (200 mm) in diameter, 12 inches (300 mm) in diameter, and 16 inches (400 mm) in diameter. Note that the shape is not limited to a circular shape, and a silicon substrate processed into a rectangular shape or the like can also be used. In the description given below, a case in which a single crystal silicon substrate is used as the semiconductor substrate 101 will be described.

Note that it is preferable that a surface of the semiconductor substrate 101 be appropriately cleaned in advance with a sulfuric acid/hydrogen peroxide mixture (SPM), an ammonium hydroxide/hydrogen peroxide mixture (APM), a hydrochloric acid/hydrogen peroxide mixture (HPM), dilute hydrofluoric acid (DHF), ozone water, or the like in terms of removal of contamination. Dilute hydrofluoric acid and ozone water may be discharged alternately for cleaning.

Figures 1, 4B:
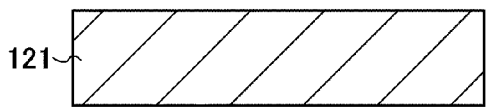
Figures 2, 4A:
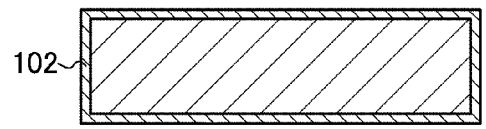
Figures 2, 4B:
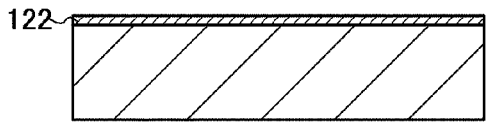
Figures 3, 4A:
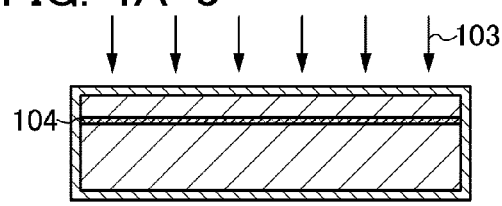
Figures 3, 4B:
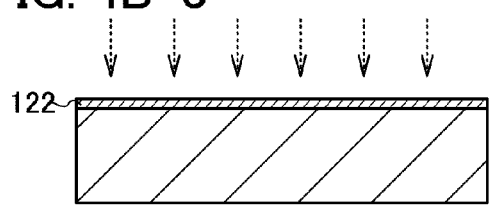

Next, an oxide film 102 is formed on the surface of the semiconductor substrate 101 (see FIG. 1A-2).

As the oxide film 102, for example, a single layer of a silicon oxide film, a silicon oxynitride film, or the like, or a stacked layer thereof can be used. These films can be formed by a thermal oxidation method, a CVD method, a sputtering method, or the like. In addition, when the oxide film 102 is formed by a CVD method, a silicon oxide film formed by using organosilane such as tetraethoxysilane (abbreviation: TEOS, chemical formula: $Si(OC_2H_5)_4$) is preferably used as the oxide film 102 in terms of productivity.

In this embodiment, the oxide film 102 (here, a $SiO_x(x>0)$ film) is formed by performing thermal oxidation treatment on the semiconductor substrate 101 (see FIG. 1A-2). The thermal oxidation treatment is preferably performed in an oxidizing atmosphere to which halogen is added.

For example, the thermal oxidation treatment is performed on the semiconductor substrate 101 in an oxidizing atmosphere to which chlorine (Cl) is added, whereby the oxide film 102 is formed through chlorine oxidation. Thus, the oxide film 102 contains chlorine atoms.

The chlorine atoms contained in the oxide film 102 cause distortions. As a result, the moisture absorption rate of the oxide film 102 is improved and the diffusion rate thereof is increased. That is, when moisture is present on a surface of the oxide film 102, the moisture present on the surface of the oxide film 102 can be rapidly absorbed and diffused into the oxide film 102.

As an example of thermal oxidation treatment, thermal oxidation may be performed in an oxidizing atmosphere which contains hydrogen chloride (HCl) at a proportion of 0.5 vol. % to 10 vol. % (preferably, 2 vol. %) with respect to oxygen at a temperature of 900° C. to 1150° C. (typically, 1000° C.). Treatment time may be set to 0.1 to 6 hours, preferably, 0.5 to 1 hour. The thickness of an oxide film to be formed is set to 10 nm to 1000 nm (preferably, 50 nm to 300 nm), for example, 100 nm.

As another example of thermal oxidation treatment, thermal oxidation may be performed in an oxidizing atmosphere which contains trans-1,2-dichloroethylene (DCE) at a proportion of 0.25 vol. % to 5 vol. % (preferably, 3 vol. %) with respect to oxygen at a temperature of 700° C. to 1150° C. (typically, 950° C.). Treatment time may be set to 0.1 to 6 hours, preferably, 0.5 to 1 hour. The thickness of an oxide film to be formed is set to 10 nm to 1000 nm (preferably, 50 nm to 300 nm), for example, 100 nm. Since the decomposition temperature of trans-1,2-dichloroethylene is low, the thermal oxidation treatment can be performed at a low temperature. In particular, when a semiconductor substrate is repeatedly reused, productivity can be improved and adverse effect due to thermal shock can be reduced by performing thermal oxidation treatment at low temperature. Note that, instead of trans-1,2-dichloroethylene, cis-1,2-dichloroethylene, 1,1-dichloroethylene, or a mixed gas of two or more of these gases may be used.

In this embodiment, the concentration of chlorine atoms in the oxide film 102 is controlled to $1\times10^{17}$ atoms/cm$^3$ to $1\times10^{21}$ atoms/cm$^3$.

In addition, the inclusion of chlorine atoms in the oxide film 102 is also effective in preventing contamination of the semiconductor substrate 101 by trapping heavy metal (such as Fe, Cr, Ni, Mo, and the like) which is an extrinsic impurity.

The inclusion of halogen such as chlorine in the oxide film 102 by HCl oxidation or the like makes it possible to perform gettering on an impurity (for example, movable ions such as Na) which gives an adverse effect on the semiconductor substrate. That is, by heat treatment which is performed after the oxide film 102 is formed, impurities included in the semiconductor substrate are separated out to the oxide film 102 and captured by reacting with the halogen (e.g., chlorine). Thus, the impurity captured in the oxide film 102 can be fixed, whereby contamination of the semiconductor substrate 101 can be prevented. Accordingly, when bonded to a glass substrate, the oxide film 102 can function as a film for neutralizing impurities such as Na included in the glass substrate.

In particular, inclusion of halogen such as chlorine in the oxide film 102 by HCl oxidation or the like is effective in a case where the semiconductor substrate is not sufficiently cleaned or in removing contamination of the semiconductor substrate which is repeatedly reused.

Further, inclusion of hydrogen in the gas for the thermal oxidation treatment has an effect of compensating a defect at the interface between the semiconductor substrate 101 and the oxide film 102 to decrease the localized state density of the interface. Therefore, it is preferable that the oxide film 102 contain hydrogen atoms at equal to or higher than $1\times10^{18}$ atoms/cm$^3$.

Note that, although the case where the thermal oxidation treatment is performed in an oxidizing atmosphere in which hydrogen chloride or dichloroethylene is contained as a formation method of the oxide film 102 containing chlorine atoms is described in the above description, an embodiment of the present invention is not limited thereto. For example, by performing thermal oxidation treatment on the semiconductor substrate 101 in an oxidizing atmosphere, the oxide film 102 (e.g. SiOx) is formed on the surface of the semiconductor substrate 101, and then chlorine atoms may be contained in the oxide film 102 by addition of chlorine ions accelerated by an electric field with the use of an ion doping apparatus or an ion implantation apparatus. Alternatively, after the surface may be processed with a hydrogen chloride (HCl) solution, thermal oxidation treatment may be performed in an oxidizing atmosphere.

Note that halogen atoms contained in the oxide film 102 are not limited to the chlorine atoms. The oxide film 102 may contain fluorine atoms. In order to perform fluorine oxidation on the surface of the semiconductor substrate 101, the following may be performed: the surface of the semiconductor substrate 101 is soaked in HF solution and then thermal oxidizing is performed thereon in an oxidation atmosphere; thermal oxidation is performed on the semiconductor substrate 101 in an oxidizing atmosphere to which $NF_3$ is added.

Next, accelerated ions 103 are introduced into the semiconductor substrate 101, whereby an embrittled region 104 having a damaged crystal structure is formed at a predetermined depth in the semiconductor substrate 101 (see FIG. 1A-3). As illustrated in FIG. 1A-3, by introducing accelerated ions 103 into the semiconductor substrate 101 through the oxide film 102, the ions 103 are added to a region at a predetermined depth from the surface of the semiconductor substrate 101, whereby the embrittled region 104 can be formed. The ions 103 are obtained as follows: a source gas is excited to generate plasma of the source gas, and ions included in this plasma are extracted from the plasma by the action of an electric field and are then accelerated.

The depth of the region where the embrittled region 104 is formed can be adjusted by the kinetic energy, the mass, the mass, and the incident angle of the ions 103. The kinetic energy can be adjusted by acceleration voltage, or the like. The embrittled region 104 is formed at a depth the same or substantially the same as the average depth at which the ions 103 have entered. Therefore, the thickness of the single crystal semiconductor layer separated from the semiconductor substrate 101 is determined by the depth to which the ions 103 are added. The depth at which the embrittled region 104 is formed is adjusted so that the thickness of the single crystal semiconductor layer can be greater than or equal to 110 nm and less than or equal to 500 nm, preferably greater than or equal to 50 nm and less than or equal to 200 nm.

The embrittled region 104 can be formed by ion doping treatment. Ion doping treatment can be performed using an ion doping apparatus. A typical ion doping apparatus is a non-mass-separation apparatus with which an object placed in a chamber is irradiated with all ion species generated by excitation of a process gas into plasma. The apparatus is called a non-mass-separation apparatus because an object is irradiated with all ions species in plasma without mass separation. In contrast, an ion implantation apparatus is a mass-separation apparatus. An ion implantation apparatus is an apparatus with which an object is irradiated with an ion species having a specific mass after mass separation of ion species in plasma.

Main components of an ion doping apparatus are as follows: a chamber in which an object is placed; an ion source for generating desired ions; and an acceleration mechanism for acceleration of ions for irradiation therewith. The ion source includes a gas supply device for supplying a source gas to generate desired ion species, an electrode for exciting a source gas to generate plasma, and the like. As the electrode for generating plasma, a filament electrode, a capacitively coupled high-frequency discharge electrode, or the like is used. The acceleration mechanism includes electrodes such as an extraction electrode, an acceleration electrode, a deceleration electrode, and a ground electrode; a power source for supplying power to these electrodes; and the like. These electrodes included in the acceleration mechanism are provided with a plurality of openings or slits, through which ions which are generated from the ion source are accelerated. Note that components of the ion doping apparatus are not limited to the above-described components and an as-needed mechanism may be provided.

In this embodiment, hydrogen is added to the semiconductor substrate 101 with an ion doping apparatus. A hydrogen-containing gas is supplied as a plasma source gas. For example, $H_2$ is supplied. A hydrogen gas is excited to generate plasma; ions included in plasma are accelerated without mass separation; and the semiconductor substrate 101 is irradiated with the accelerated ions.

In an ion doping apparatus, the percentage of $H_3^+$ to the total amount of ion species ($H^+$, $H_2^+$, and $H_3^+$) that are generated from a hydrogen gas is set to 50% or more. Preferably, the percentage of $H_3^+$ is set to 80% or more. Because an ion doping apparatus does not involve mass separation, the percentage of one ($H_3^+$) of plural kinds of ion species that are generated in plasma is preferably 50% or more, more preferably, 80% or more. By irradiation with ions having the same mass, ions can be added in a concentrated manner to the same depth in the semiconductor substrate 101.

In order to form the embrittled region 104 in a shallow region, the acceleration voltage for the ions 103 needs to be low. By increase in the percentage of $H_3^+$ ions in plasma, the embrittled region 104 can be formed in a shallow region. Since the mass of an $H_3^+$ ion is three times as large as that of an $H^+$ ion, $H_3^+$ ions are added in a shallower region than $H^+$ ions when an acceleration voltage is the same.

Because the mass of an $H_3^+$ ion is three times as large as that of an $H^+$ ion, when one hydrogen atom is added to the same depth, the acceleration voltage for an $H_3^+$ ion can be three times as high as that of an $H^+$ ion. When the acceleration voltage for ions can be increased, the takt time of an ion irradiation step can be shortened and productivity and throughput can be improved. Accordingly, by increase in the percentage of $H_3^+$ ions, atomic hydrogen (H) can be efficiently added to the semiconductor substrate 101.

Because ion doping apparatuses are inexpensive and excellent for use in large-area treatment, by irradiation with $H_3^+$ by use of such an ion doping apparatus, significant effects such as an improvement in semiconductor characteristics, an increase in area, a reduction in costs, and an improvement in production efficiency can be obtained. Further, in the case where an ion doping apparatus is used, heavy metals may also be introduced; however, by irradiation with ions through the oxide film 102 containing chlorine atoms, the semiconductor substrate 101 can be prevented from being contaminated due to these heavy metals as described above.

Note that the step of introducing the accelerated ions 103 into the semiconductor substrate 101 can also be performed with an ion implantation apparatus. An ion implantation apparatus is a mass-separation apparatus which introduces specific ion species into an object placed in a chamber after mass separation of plural kinds of ion species generated by excitation of a source gas into plasma. Thus, in the case of using an ion implantation apparatus, $H^+$ ions and $H_2^+$ ions that are generated by excitation of a hydrogen gas and $PH_3$ are subjected to mass separation, and either $H^+$ ions or $H_2^+$ ions are accelerated and introduced into the semiconductor substrate 101.

Next, a supporting substrate 121 is prepared (see FIG. 1B-1).

As the supporting substrate 121, a substrate formed of an insulator is used. Specifically, a variety of glass substrates that are used in the electronics industry, such as aluminosilicate glass substrates, aluminoborosilicate glass substrates, and barium borosilicate glass substrates; quartz substrates; ceramic substrates; and sapphire substrates can be given. In this embodiment, a case of using a glass substrate is described. By using a glass substrate which can have a large area and is inexpensive as the supporting substrate 121, the cost can be reduced as compared to the case of using a silicon wafer.

Further, a surface of the supporting substrate 121 is preferably cleaned before the supporting substrate 121 is used. Specifically, ultrasonic cleaning is performed on the supporting substrate 121 using a sulfuric acid/hydrogen peroxide mixture (SPM), an ammonium hydroxide/hydrogen peroxide mixture (APM), a hydrochloric acid/hydrogen peroxide mixture (HPM), diluted hydrogen fluoride (DHF), ozone water, or the like. For example, ultrasonic cleaning is preferably performed on the surface of the supporting substrate 121 using a hydrochloric acid/hydrogen peroxide mixture. By such cleaning treatment, the surface of the supporting substrate 121 can be planarized and abrasive particles remaining on the surface can be removed.

Next, the surface of the semiconductor substrate 101 and the surface of the supporting substrate 121 are disposed to face each other, and the surface of the oxide film 102 and the surface of the supporting substrate 121 are bonded to each other (see FIG. 1C).

Here, after the semiconductor substrate 101 and the supporting substrate 121 are disposed in contact with each other, a pressure of about 1 to 500 $N/cm^2$, preferably, 1 to 20 $N/cm^2$ is applied to a portion of the semiconductor substrate 101. From the portion where pressure is applied, the oxide film 102 and the supporting substrate 121 start bonding to each other and the spontaneous bonding proceeds throughout almost the entire surface. This bonding step is performed by the action of van der Waals force or hydrogen bonding and can be performed at room temperature without heat treatment. Thus, a substrate having a low heat resistance, such as a glass substrate, can be used as the supporting substrate 121.

Note that, before the semiconductor substrate 101 and the supporting substrate 121 are bonded to each other, the oxide film 102 formed on the semiconductor substrate 101 and the supporting substrate 121 are preferably subjected to surface treatment. As surface treatment, ozone treatment (such as cleaning with ozone water), megasonic cleaning, two fluid cleaning (a method in which spraying functional water such as pure water or hydrogen-containing water with a carrier gas such as nitrogen), or a combination thereof can be performed. Alternatively, cleaning with ozone water and cleaning with hydrofluoric acid may be repeated plural times. In particular, after plasma treatment is performed on the surface of the oxide film 102 and the surface of the supporting substrate 121 as described above, surface treatment is performed, whereby dust such as organic substances on the surface of the oxide film 102 and the surface of the supporting substrate 121 can be removed and the surfaces can be made hydrophilic. As a result, bonding strength between the oxide film 102 and the supporting substrate 121 can be improved.

Note that, after the semiconductor substrate 101 is bonded to the supporting substrate 121, heat treatment is preferably performed in order to increase the bonding strength between the oxide film 102 and the supporting substrate 121. This heat treatment is performed at a temperature where a crack is not generated in the embrittled region 104 and is performed at a temperature higher than or equal to room temperature and lower than 400° C., for example. The oxide film 102 may be bonded to the supporting substrate 121 while heating at a temperature within the above range. The heat treatment can be performed using a diffusion furnace, a heating furnace such as a resistance heating furnace, a rapid thermal annealing (RTA) apparatus, a microwave heating apparatus, or the like.

In general, when heat treatment is performed at the same time as or after the bonding of the oxide film 102 and the supporting substrate 121, dehydration reaction proceeds at the bonding interface and the bonding surfaces come closer. Thus, the bonding is strengthened by strengthening hydrogen bond or forming a covalent bond. In order to promote the dehydration reaction, moisture generated at the bonding interface through the dehydration reaction should be removed by heat treatment at high temperature. In other words, when heat treatment after bonding is performed at low temperature, moisture generated at the bonding interface through a dehydration reaction cannot be removed effectively; thus, the dehydration reaction does not proceed and bonding strength cannot be improved sufficiently.

On the other hand, in the case where an oxide film containing chlorine atoms or the like is used as the oxide film 102, the oxide film 102 can absorb and diffuse moisture. Thus, even when heat treatment after bonding is performed at low temperature, moisture generated at the bonding interface through the dehydration reaction can be absorbed and diffused into the oxide film 102, and the dehydration reaction can be promoted efficiently. In this case, even when a low heat-resistant substrate such as a glass substrate is used as the supporting substrate 121, the bonding strength between the oxide film 102 and the supporting substrate 121 can be sufficiently improved.

Next, heat treatment is performed to carry out separation (cleavage) along the embrittled region 104, whereby a single crystal semiconductor layer 123 (here, a single crystal silicon layer) is provided over the supporting substrate 121 with the oxide film 102 interposed therebetween (see FIG. 1D).

When the heat treatment is performed, the atom added is separated out into microvoids which are formed in the embrittled region 104 by increase in temperature, and internal pressure of the microvoids is increased. By increasing the pressure, the microvoids in the embrittled region 104 are changed in volume and a crack is generated in the embrittled region 104. Thus, the semiconductor substrate 101 is cleaved along the embrittled region 104. Because the oxide film 102 is bonded to the supporting substrate 121, the single crystal semiconductor layer 123 which is separated from the semiconductor substrate 101 is formed over the supporting substrate 121. This heat treatment is performed at a temperature not exceeding the strain point of the supporting substrate 121.

This heat treatment can be performed using a diffusion furnace, a heating furnace such as a resistance heating furnace, a rapid thermal annealing (RTA) apparatus, a microwave heating apparatus, or the like. For example, the heat treatment can be performed using an RTA apparatus at a heating temperature of higher than or equal to 550° C. and lower than or equal to 730° C. for greater than or equal to 0.5 minute and less than or equal to 60 minutes.

Note that, by the heat treatment of FIG. 1D without the above-described heat treatment for increasing the bonding strength between the supporting substrate 121 and the oxide film 102, the heat treatment step for increasing the bonding strength between the oxide film 102 and the supporting substrate 121 and the heat treatment step for causing separation along the embrittled region 104 may be performed at the same time.

Through the above steps, an SOI substrate in which the single crystal semiconductor layer 123 is provided over the supporting substrate 121 with the oxide film 102 interposed therebetween can be manufactured. With the manufacturing method described in this embodiment, even in the case where the oxide film 102 is used as the bonding layer, the bonding strength between the supporting substrate 121 and the single crystal semiconductor layer 123 can be improved and reliability can be improved. As a result, diffusion of impurities into the single crystal semiconductor layer 123 formed over the supporting substrate 121 can be suppressed and an SOI substrate in which the supporting substrate 121 and the single crystal semiconductor layer 123 are disposed in close contact firmly can be formed.

In addition, by forming the oxide film containing a halogen such as chlorine on the semiconductor substrate side, a manufacturing process can be simplified and impurity elements can be prevented from entering the semiconductor substrate before bonding the supporting substrate and the semiconductor substrate to each other. Further, by forming the oxide film containing a halogen such as chlorine as a bonding layer which is provided on the semiconductor substrate side, bonding strength can be improved by promoting dehydrogenation reaction efficiently even when the heat treatment after bonding is performed at low temperature.

Next, crystal defects remaining on the surface of the single crystal semiconductor layer 123 bonded to the supporting substrate are removed by etching. Defects due to the ion addition step for forming the embrittled region 104 or the separation step exist on the surface of the single crystal semiconductor layer 123 illustrated in FIG. 2A, and planarity of the surface of the single crystal semiconductor layer is damaged. It is difficult to form a gate insulating layer which is thin and has high withstand voltage on such a surface of the single crystal semiconductor layer 123 whose planarity is damaged. When the single crystal semiconductor layer 123 has defects, performance and reliability of transistors may be adversely affected; for example, the localized state density at the interface between a gate insulating layer and the single crystal semiconductor layer 123 is increased. Therefore, treatment for removing the defects of the single crystal semiconductor layer 123 is performed. Note that the uneven shape of the surface of the single crystal semiconductor layer 123 in FIG. 2A just shows characteristically that the surface is rough and has poor planarity, and the actual shape is not limited thereto. Note that the thickness of the single crystal semiconductor layer 123 which is obtained by the separation step is about 130 nm to 140 nm.

Figure 2B:
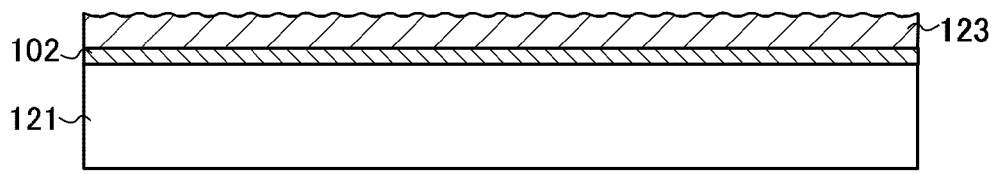

In order to remove the defects existing on the surface of the single crystal semiconductor layer 123, first etching is performed on the surface of the single crystal semiconductor layer 123 (see FIG. 2B). In this embodiment, for example, a dry etching method such as reactive ion etching (RIE), inductively coupled plasma (ICP) etching, electron cyclotron resonance (ECR) etching, parallel plate (capacitively coupled plasma) etching, magnetron plasma etching, dual-frequency plasma etching, or helicon wave plasma etching is used.

By removal of the surface of the single crystal semiconductor layer 123 by performing etching on the single crystal semiconductor layer 123, the defects formed on the surface of the single crystal semiconductor layer 123 can be removed, and thus surface roughness of the single crystal semiconductor layer 123 can be reduced. For example, when ICP etching is used, etching may be performed under the following conditions: the flow rate of chlorine, which is an etching gas: 40 sccm to 100 sccm; power applied to a coil type electrode: 100 W to 200 W; the power applied to a lower electrode (on the bias side): 40 W to 100 W; and the reaction pressure: 0.5 Pa to 1.0 Pa. For the etching gas, a chlorine-based gas such as chlorine, boron chloride, silicon chloride or carbon tetrachloride; a fluorine-based gas such as carbon tetrafluoride, sulfur fluoride, or nitrogen fluoride; or oxygen is used as appropriate. The size and depth of the defect of the single crystal semiconductor layer results from the amount of energy or the dose of addition of ions. Thus, the thickness of the single crystal semiconductor layer to be removed by the first etching may be set as appropriate depending on the thickness of the single crystal semiconductor layer 123 before the first etching and surface roughness thereof.

The first etching illustrated in FIG. 2B can be performed as follows: a flow rate of chlorine, which is an etching gas: 100 sccm, power applied to the coil electrode: 150 W, power applied to the lower electrode: 40 W, and reaction pressure: 1.0 Pa to remove the single crystal semiconductor layer 123 to about 120 nm.

By the first etching performed on the surface of the single crystal semiconductor layer bonded to the supporting substrate by separation of the single crystal semiconductor substrate, the defects due to the ion addition step or the separation step can be removed; thus, surface roughness of the single crystal semiconductor layer can be reduced.

Figure 2C:
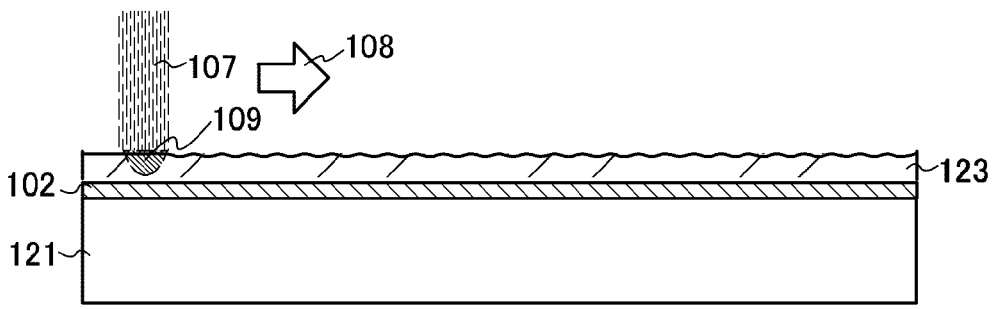

Note that crystal defects are formed in the single crystal semiconductor layer 123 bonded to the supporting substrate 121 owing to formation of the embrittled region 104 and separation at the embrittled region 104. In order to reduce the crystal defects in the single crystal semiconductor layer 123 and recover the crystallinity of the single crystal semiconductor layer 123, the single crystal semiconductor layer 123 is irradiated with a laser beam 107 as illustrated in FIG. 2C.

As indicated by an arrow 108, the surface of the single crystal semiconductor layer 123 is irradiated with a laser beam 107 in such a manner that the single crystal semiconductor layer 123 is scanned with the laser beam 107 while the supporting substrate 121 is moved. By irradiation with the laser beam 107, part of the single crystal semiconductor layer 123 or the entire layer in the depth direction is melted. When the single crystal semiconductor layer is melted, planarity is increased by an effect of surface tension. In FIG. 2C, the state in which part of the single crystal semiconductor layer is melted is schematically shown, and at least part of a part 109 surrounded by a dotted line becomes a liquid phase after exceeding 1410° C. which is the melting point of silicon.

By irradiation with the laser beam 107 from an upper surface side of the single crystal semiconductor layer, the upper surface of the single crystal semiconductor layer can be melted. After being melted, the single crystal semiconductor layer is cooled and solidified, whereby a single crystal semiconductor layer with improved upper surface planarity can be obtained. With the use of the laser beam 107, the supporting substrate 121 is not directly heated; thus, increase in the temperature of the supporting substrate 121 can be suppressed. Accordingly, a substrate having a low heat resistance, such as a glass substrate, can be used as the supporting substrate 121.

The melting state of the single crystal semiconductor layer 123 by irradiation with the laser beam 107 may be either partially-melted state or completely-melted state. Note that the term "complete melting" here means that the single crystal semiconductor layer 112 is melted to the vicinity of the lower interface to be made in a liquid phase. On the other hand, in this case, the term "partial melting" means that the upper part of the single crystal semiconductor layer is melted to be made in a liquid phase while the lower part thereof is not melted and is still in a solid phase. Preferably, the upper layer (the superficial layer side) is melted to be in a liquid phase and the lower layer (the supporting substrate side) is not melted to be in a solid phase so that a partially-melted state is obtained, whereby crystal growth proceeds from the solid phase portion. Thus, the defects in the single crystal semiconductor layer can be reduced.

For the above-described laser beam irradiation, a pulsed laser is preferably used. This is because a pulsed laser can instantaneously emit a pulsed laser beam with high energy and a melted state can easily be obtained. The repetition rate is preferably about greater than or equal to 1 Hz and less than or equal to 10 MHz.

Figure 2D:
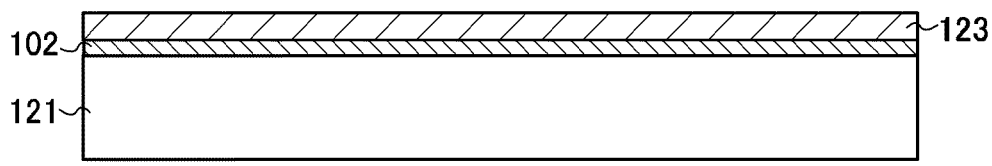

The single crystal semiconductor layer 123 is irradiated with the laser beam as described above, part or the whole of the single crystal semiconductor layer is melted and recrystallized, so that a better single crystal semiconductor layer can be obtained (see FIG. 2D). Accordingly, defects caused by addition of ions can be reduced, and a single crystal semiconductor layer whose crystallinity is recovered can be obtained. Moreover, etching is performed before laser beam irradiation, whereby the single crystal semiconductor layer can be prevented from including defects or damage at the time of being melted.

In this manner, the laser beam irradiation makes it possible to heat and cool down a surface of the supporting substrate in a short time; thus, increase in the temperature of the supporting substrate can be suppressed, and a substrate having a low heat resistance, such as a glass substrate, can be used as the supporting substrate. Thus, damage in the single crystal semiconductor layer due to the ion addition step can be sufficiently repaired.

Next, treatment is performed for reducing the thickness of the single crystal semiconductor layer 123 to such a thickness that is optimal for a semiconductor element to be formed later (see FIG. 2E). This thinning step is preferably performed by etching in which a substrate bias is not applied (also referred to as second etching).

Figure 3:
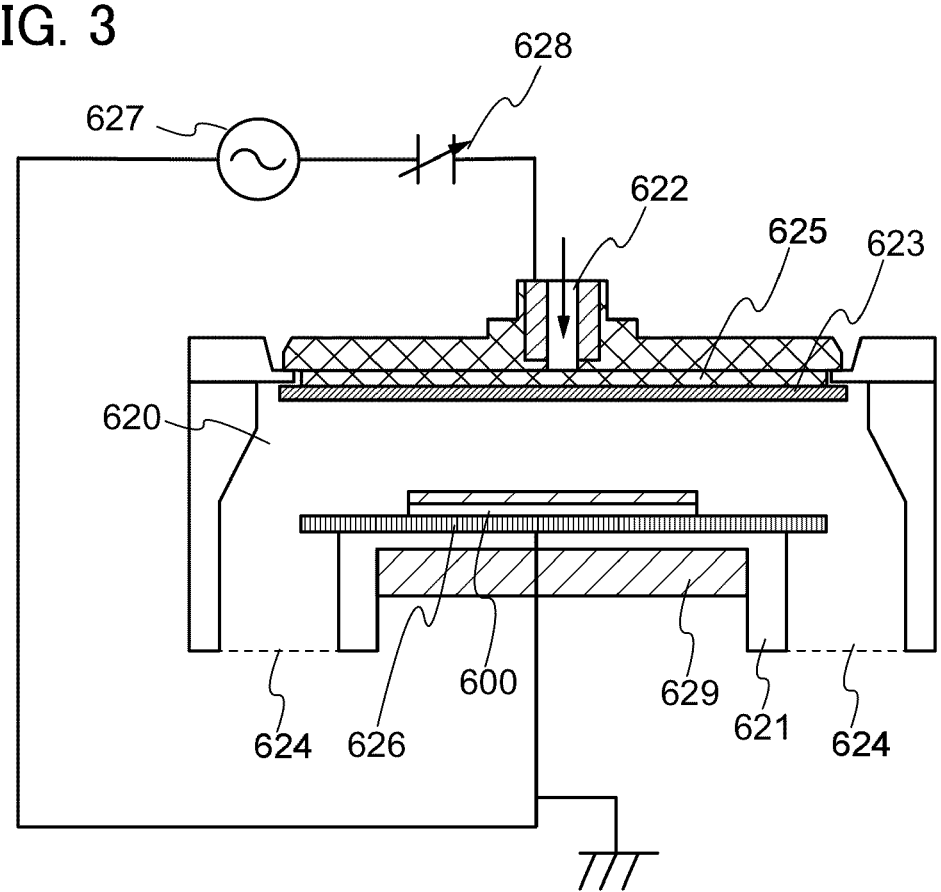
FIG. 3 is a view illustrating an example of a plasma CVD apparatus.

FIG. 3 illustrates an example of a structure of a parallel plate (capacitive coupling) plasma CVD apparatus as an example of an apparatus which is used in this embodiment. The plasma CVD apparatus illustrated in FIG. 3 includes a process chamber 620, a stage 621, a gas supply portion 622, a shower plate 623, an exhaust port 624, an upper electrode 625, a lower electrode 626, an alternate-current power source 627, a matching controller 628, and a temperature controller 629. The distance between the upper electrode 625 and the lower electrode 626 is about 10 mm to 70 mm.

When treatment is performed with the plasma CVD apparatus illustrated in FIG. 3, a given gas is supplied from the gas supply portion 622. The gas is introduced into the process chamber 620 through the shower plate 623. High-frequency power is applied by the alternate-current power source 627 connected to the upper electrode 625 and the lower electrode 626 to excite the gas in the process chamber 120, thereby generating plasma. Further, the gas in the process chamber 620 is exhausted through the exhaust port 624 which is connected to a vacuum pump. Further, the temperature controller 629 makes it possible to perform etching while an object is being heated. Note that the lower electrode 626 is grounded.

In the case of using the plasma CVD apparatus illustrated in FIG. 3, the etching of the single crystal semiconductor layer 123 is performed in a mixed gas of $NF_3$ and $N_2$. At this time, it is preferable that the flow ratio of $N_2$ to $NF_3$ that are introduced into the process chamber 620 be about 40:1; for example, the flow rate of $N_2$ is 400 sccm and that of $NF_3$ is 10 sccm.

Note that conditions of the second etching can be as follows: the RF power is 15 W to 50 W (the power frequency: 13.56 MHz), the pressure of the process chamber 620 at the time of the second etching is 65 Pa to 100 Pa, the distance between the substrates is 21 mm to 30 mm, and the temperature of the supporting substrate 121 is 200° C., specifically, the RF power is 50 W (13.56 MHz), the pressure of the process chamber 620 at the time of the second etching is 65 Pa, the distance between the substrates is 30 mm, and the temperature of the supporting substrate 121 is 200° C.

By the second etching, the single crystal semiconductor layer is preferably thinned to a thickness of greater than or equal to 5 nm and less than or equal to 100 nm, more preferably greater than or equal to 5 nm and less than or equal to 60 nm. By performing the second etching in this manner, the thickness of the single crystal semiconductor layer 123 can be reduced to the thickness which is optimum for a semiconductor element to be formed later.

When a substrate bias is applied in etching the single crystal semiconductor layer 123, there is concern that plasma damage is caused in the single crystal semiconductor layer 123. Further, there is concern that impurities are introduced into the single crystal semiconductor layer. However, according to an embodiment of the present invention, since the single crystal semiconductor layer 123 is etched with no substrate bias applied, the single crystal semiconductor layer 123 can be etched so that plasma damage is not caused in the single crystal semiconductor layer 123. Further, impurities present on the surface of the single crystal semiconductor layer can be prevented from being introduced into the single crystal semiconductor layer. Furthermore, decrease in performance and reliability of a semiconductor device, which is caused by introduction of impurities into the single crystal semiconductor layer, can be prevented.

The etching is performed using an $NF_3$ gas, whereby dangling bonds formed in the single crystal semiconductor layer are terminated with fluorine, so that electrical characteristics can be improved. Further, planarity of the surface of the single crystal semiconductor layer 123 can be improved.

After the thinning step, heat treatment is preferably performed on the single crystal semiconductor layer 123 at higher than or equal to 500° C. and lower than or equal to 700° C. By this heat treatment, the defects of the single crystal semiconductor layer 123, which are not repaired by irradiation with the laser beam 107, can be eliminated and distortion of the single crystal semiconductor layer 123 can be relieved. For this heat treatment, as an RTA apparatus, a gas rapid thermal anneal (GRTA) apparatus which performs heat treatment using a high-temperature gas or a lamp rapid thermal anneal (LRTA) apparatus which performs heat treatment using lamp light can be used. For example, when a resistance heating furnace is used, heat treatment may be performed at 600° C. for 4 hours.

Figure 2E:
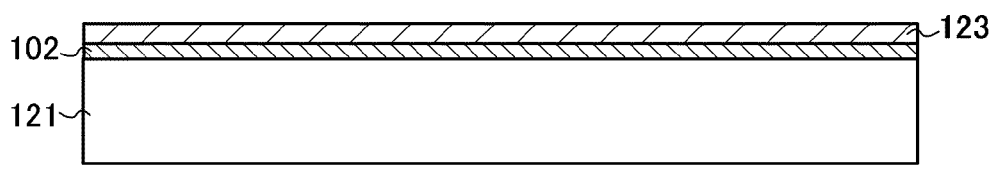

Through the above-described steps, an SOI substrate illustrated in FIG. 2E can be manufactured.

In this embodiment, a case in which the first etching is performed with a substrate bias applied is described; however, an embodiment of the present invention is not limited thereto. The first etching can also be performed with no substrate bias applied.

When the first etching is also performed with no substrate bias applied, the single crystal semiconductor layer 123 can be etched so that plasma damage is not caused in the single crystal semiconductor layer 123. Further, impurities present on the surface of the single crystal semiconductor layer can be prevented from being introduced into the single crystal semiconductor layer. Furthermore, decrease in performance and reliability of a semiconductor device, which is caused by introduction of impurities into the single crystal semiconductor layer, can be prevented.

According to an embodiment of the present invention, an SOI substrate in which contamination of the single crystal semiconductor layer due to impurities such as a metal element and the like is suppressed can be manufactured. Further, decrease in performance and reliability of a semiconductor device which is formed using such an SOI substrate can be prevented.

Note that the method for manufacturing an SOI substrate described in this embodiment can be appropriately combined with a manufacturing method in another embodiment in this specification.

Embodiment 2

In this embodiment, a method for manufacturing an SOI substrate, which is different from that in Embodiment 1, will be described with reference to the drawings.

First, the semiconductor substrate 101 whose surface is provided with the oxide film 102 and in which the embrittled region 104 is provided at a predetermined depth is prepared (see FIGS. 4A-1 to 4A-3). Note that, steps illustrated in FIGS. 4A-1 to 4A-3 can be performed in a manner similar to those illustrated in FIGS. 1A-1 to 1A-3.

Next, the supporting substrate 121 is prepared (see FIG. 4B-1). Note that a step illustrated in FIG. 4B-1 can be performed in a manner similar to that illustrated in FIG. 1B-1.

Next, an insulating layer 122 is formed over the surface of the supporting substrate 121 (see FIG. 4B-2). The insulating layer 122 is preferably an insulating layer containing nitrogen, such as a silicon nitride film ($SiN_x$) or a silicon nitride oxide film ($SiN_xO_y$, where x>y).

In this embodiment, the insulating layer 122 serves as a layer (bonding layer) which is to be bonded to the oxide film 102 provided on the semiconductor substrate 101. In addition, when a single crystal semiconductor layer having a single crystal structure (hereinafter referred to as a "single crystal semiconductor layer") is provided over a supporting substrate later, the insulating layer 122 also functions as a barrier layer for preventing impurities such as Na (sodium) contained in the supporting substrate from diffusing into the single crystal semiconductor layer.

Next, at least one of the surface of the oxide film 102 formed on the semiconductor substrate 101 and the surface of the insulating layer 122 formed over the supporting substrate 121 is preferably subjected to plasma treatment. In this embodiment, a case in which the surface of the insulating layer 122 formed over the supporting substrate 121 is subjected to plasma treatment will be described (see FIG. 4B-3).

The plasma treatment is performed in a plasma state which is produced by introducing an inert gas (e.g., an argon (Ar) gas) and/or a reactive gas (e.g., an oxygen ($O_2$) gas or a nitrogen ($N_2$) gas) into a chamber in a vacuum state and applying a bias voltage to a surface to be processed.

For example, in the case where oxygen plasma treatment is performed, the oxygen plasma treatment is performed in a plasma state which is produced by introducing a gas into a vacuum chamber and applying a bias voltage to an object to be processed. Oxygen cations are present in plasma and accelerated in a cathode direction (to the semiconductor substrate 101 side). The accelerated oxygen cations collide with the surface to be processed, whereby impurities such as organic substances of the surface to be processed can be removed and the surface to be processed can be activated.

Further, in the case where plasma treatment is performed on the insulating layer 122 over the supporting substrate 121, SiN and $SiH_3$ each having a hydrophobic property on the surface of the insulating layer 122 containing nitrogen can be decreased, and SiOx having a hydrophilic property can be increased; therefore, bonding strength can be improved even in the case where the insulating layer 122 containing nitrogen is used as a bonding layer.

Figure 4C:
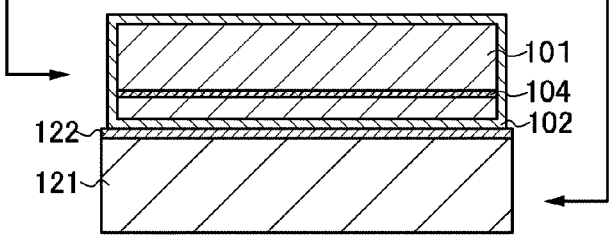
Figure 4D:
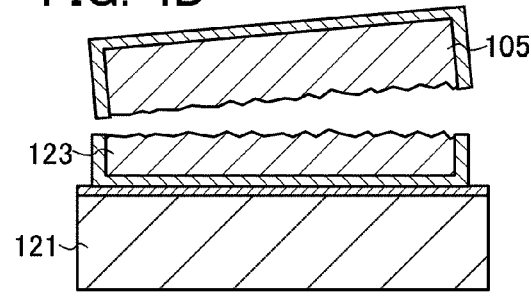

After that, the surface of the semiconductor substrate 101 and the surface of the supporting substrate 121 are disposed to face each other and the surface of the oxide film 102 and the surface of the insulating layer 122 are bonded to each other (see FIG. 4C). Then, separation (cleavage) along the embrittled region 104 is performed by heat treatment, whereby the single crystal semiconductor layer 123 is provided over the supporting substrate 121 with the oxide film 102 and the insulating layer 122 interposed therebetween (see FIG. 4D).

After that, in a manner similar to the steps illustrated in FIGS. 2A to 2E, the first etching, the laser beam irradiation, and the second etching are performed, whereby an SOI substrate according to an embodiment of the present invention can be manufactured.

Impurities can be restrained from diffusing into the single crystal semiconductor layer formed over the supporting substrate and bonding strength between the single crystal semiconductor layer and the supporting substrate can be improved. Further, even in the case where the insulating film containing nitrogen is used as a bonding layer in bonding the semiconductor substrate and the supporting substrate, reliability can be improved.

According to an embodiment of the present invention, an SOI substrate in which contamination of the single crystal semiconductor layer due to impurities such as a metal element is suppressed can be manufactured. Further, decrease in performance and reliability of a semiconductor device which is formed using such an SOI substrate can be prevented.

Note that a method for manufacturing an SOI substrate described in this embodiment can be combined with the manufacturing method described in Embodiment 1 in this specification as appropriate.

Embodiment 3

In this embodiment, a method for manufacturing a semiconductor device using the SOI substrate which is manufactured according to any of the above embodiments will be described.

First, a method for manufacturing an n-channel thin film transistor and a p-channel thin film transistor will be described with reference to FIGS. 5A to 5E and FIGS. 6A to 6D. Various kinds of semiconductor devices can be formed by combining a plurality of thin film transistors (TFTs). Note that repetitive descriptions for the same components as or components having similar functions to the components in Embodiments 1 and 2 are omitted.

Figure 5A:
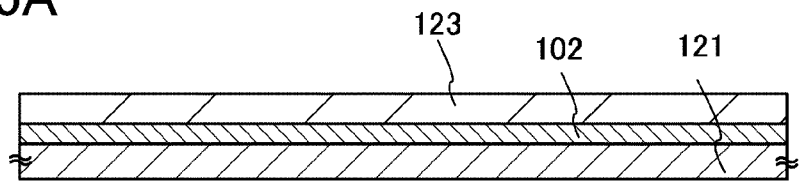
FIGS. 5A to 5E are views illustrating a method for manufacturing a semiconductor device according to an embodiment of the present invention.

In FIG. 5A, the oxide film 102 and the single crystal semiconductor layer 123 are formed over the supporting substrate 121. Although an example is shown here in which an SOI substrate having the structure illustrated in FIG. 5A (refer to Embodiment 1) is used, an SOI substrate having the structure described in Embodiment 2 in this specification can also be used.

Figure 5B:
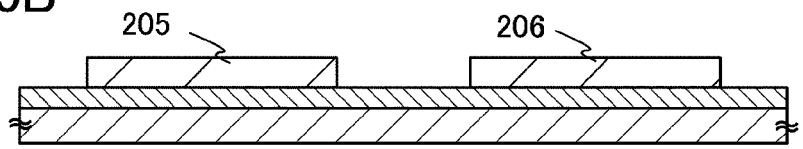

The single crystal semiconductor layer 123 is etched into island shapes in accordance with the position of the semiconductor elements, so that separated single crystal semiconductor layers 205 and 206 are formed (see FIG. 5B).

An oxide film over the single crystal semiconductor layer is removed, and a gate insulating layer 207 which covers the single crystal semiconductor layers 205 and 206 is formed. The single crystal semiconductor layers 205 and 206 in this embodiment have high planarity. Accordingly, even if the gate insulating layer which covers the single crystal semiconductor layers 205 and 206 is a thin film, the gate insulating layer can cover the single crystal semiconductor layers 205 and 206 with favorable coverage. Therefore, a property defect due to insufficient coverage with the gate insulating layer can be prevented, and a highly reliable semiconductor device can be manufactured with high yield. Reduction in the thickness of the gate insulating layer 207 has an effect of operating a thin film transistor with low voltage at high speed.

The gate insulating layer 207 may be formed using silicon oxide or a stacked structure of silicon oxide and silicon nitride. The gate insulating layer 207 may be formed by depositing an insulating film by a plasma CVD method or a low pressure CVD method or may be formed by solid phase oxidation or solid phase nitridation by plasma treatment. This is because a gate insulating layer formed by oxidation or nitridation of a single crystal semiconductor layer by plasma treatment is dense, has high withstand voltage, and is excellent in reliability.

As the gate insulating layer 207, a high dielectric constant material such as zirconium dioxide, hafnium oxide, titanium dioxide, or tantalum pentoxide may be used. Using a high dielectric constant material for the gate insulating layer 207 makes it possible to reduce gate leakage current.

Figure 5C:
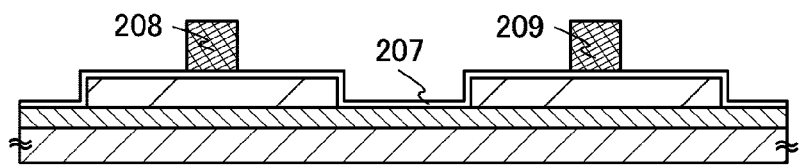
Figure 5D:
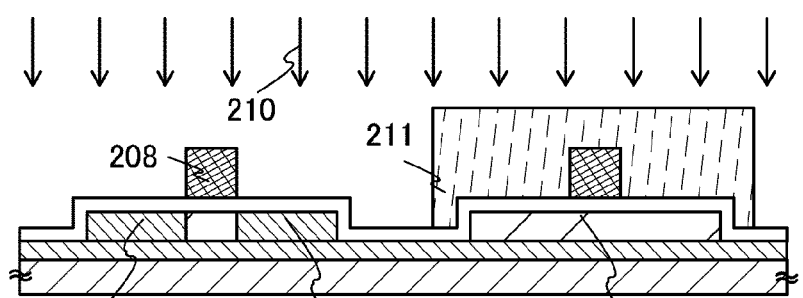
Figure 5E:
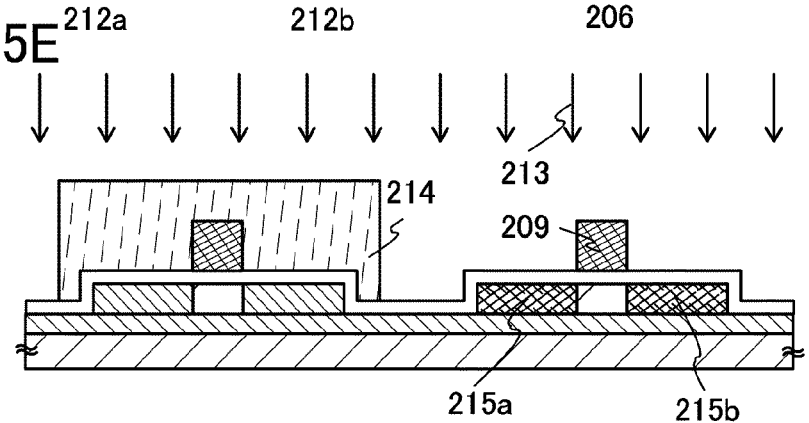

A gate electrode layer 208 and a gate electrode layer 209 are formed over the gate insulating layer 207 (see FIG. 5C). The gate electrode layers 208 and 209 can be formed by a sputtering method, an evaporation method, a CVD method, or the like. The gate electrode layers 208 and 209 may be formed of an element selected from tantalum (Ta), tungsten (W), titanium (Ti), molybdenum (Mo), aluminum (Al), copper (Cu), chromium (Cr), or neodymium (Nd); or an alloy material or a compound material containing any of the above elements as its main component. Alternatively, as the gate electrode layers 208 and 209, a semiconductor layer typified by a polycrystalline silicon layer doped with an impurity element such as phosphorus, or an AgPdCu alloy may be used.

A mask 211 which covers the single crystal semiconductor layer 206 is formed. With use of the mask 211 and the gate electrode layer 208 as masks, an impurity element 210 imparting n-type conductivity is added to form first n-type impurity regions 212a and 212b (see FIG. 5D). In this embodiment, phosphine ($PH_3$) is used as a doping gas containing an impurity element. Here, doping is performed so that the first n-type impurity regions 212a and 212b contain an impurity element imparting n-type conductivity at a concentration of about $1\times10^{17}$ atoms/cm$^3$ to $5\times10^{18}$ atoms/cm$^3$. In this embodiment, phosphorus (P) is used as an impurity element imparting n-type conductivity.

Next, a mask 214 which covers the single crystal semiconductor layer 205 is formed. With use of the mask 214 and the gate electrode layer 209 as masks, an impurity element 213 imparting p-type conductivity is added to form first p-type impurity regions 215a and 215b (see FIG. 5E). In this embodiment, diborane ($B_2H_6$) or the like is used as a doping gas containing an impurity element because boron (B) is used as an impurity element.

Figure 6A:
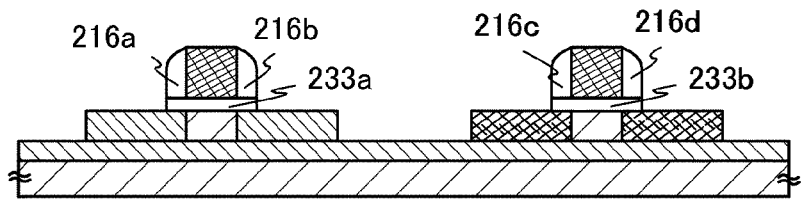
FIGS. 6A to 6D are views illustrating a method for manufacturing a semiconductor device according to an embodiment of the present invention.
Figure 6B:
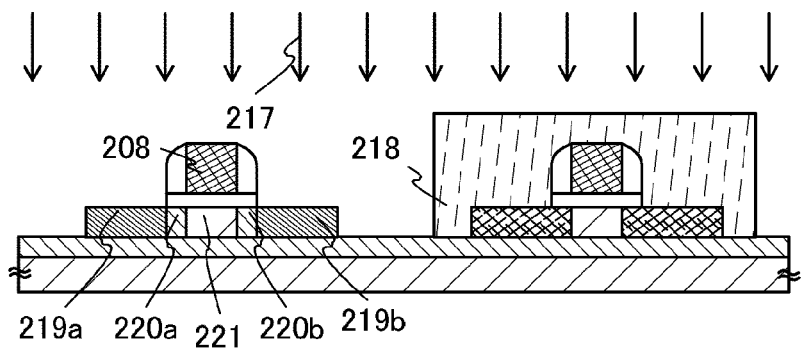
Figure 6C:
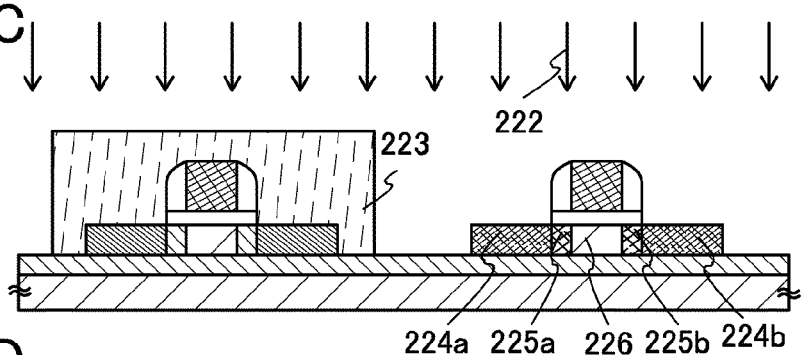

The mask 214 is removed, sidewall insulating layers 216a to 216d with a sidewall structure are formed on side surfaces of the gate electrode layers 208 and 209, and gate insulating layers 233a and 233b are formed (see FIG. 6A). The sidewall insulating layers 216a to 216d with a sidewall structure may be formed on the side surfaces of the gate electrode layers 208 and 209 in a self-alignment manner, in the following manner: an insulating layer covering the gate electrode layers 208 and 209 is formed and is processed by anisotropic etching using an RIE (reactive ion etching) method. Here, there is no particular limitation on the insulating layers and the insulating layers are preferably layers of silicon oxide with favorable step coverage, which are formed by reaction of TEOS (tetraethyl orthosilicate), silane, or the like with oxygen, nitrous oxide, or the like. The insulating layers can be formed by thermal CVD, plasma CVD, atmospheric pressure CVD, bias ECRCVD, sputtering, or the like. The gate insulating layers 233a and 233b can be formed by etching of the gate insulating layer 207 with use of the gate electrode layers 208 and 209 and the sidewall insulating layers 216a to 216d as masks.

In this embodiment, in etching the insulating layer, the insulating layer over the gate electrode layers is removed to expose the gate electrode layers. However, the sidewall insulating layers 216a to 216d may be formed to have a shape in which the insulating layer over the gate electrode layers remains. In addition, a protective film may be formed over the gate electrode layers in a later step. By protection of the gate electrode layers in this manner, film reduction of the gate electrode layers can be prevented when the gate electrode layers are processed by etching. In the case of forming silicide in a source region and a drain region, since a metal film formed for formation of the silicide is not in contact with the gate electrode layers, even when a material of the metal film can easily react with a material of the gate electrode layer, defects such as chemical reaction or diffusion can be prevented. Various etching methods such as a dry etching method or a wet etching method may be used for etching. In this embodiment, a dry etching method is used. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate.

Next, a mask 218 which covers the single crystal semiconductor layer 206 is formed. With use of the mask 218, the gate electrode layer 208, and the sidewall insulating layers 216a and 216b as masks, an impurity element 217 imparting n-type conductivity is added to form second n-type impurity regions 219a and 219b and third n-type impurity regions 220a and 220b. In this embodiment, $PH_3$ is used as a doping gas containing an impurity element. Here, the doping is performed so that the second n-type impurity regions 219a and 219b contain an impurity element imparting n-type conductivity at a concentration of about $5\times10^{19}$ atoms/cm$^3$ to $5\times10^{20}$ atoms/cm$^3$. In addition, a channel formation region 221 is formed in the single crystal semiconductor layer 205 (see FIG. 6B).

The second n-type impurity regions 219a and 219b are high-concentration n-type impurity regions and serve as a source and a drain. On the other hand, the third n-type impurity regions 220a and 220b are low-concentration impurity regions and serve as LDD (lightly doped drain) regions. Since the third n-type impurity regions 220a and 220b are formed in Loff regions, which are not covered with the gate electrode layer 208, off current can be reduced. Accordingly, a semiconductor device with higher reliability and lower power consumption can be manufactured.

The mask 218 is removed, and a mask 223 which covers the single crystal semiconductor layer 205 is formed. With use of the mask 223, the gate electrode layer 209, and the sidewall insulating layers 216c and 216d as masks, an impurity element 222 imparting p-type conductivity is added to form second p-type impurity regions 224a and 224b, and third p-type impurity regions 225a and 225b.

Doping is performed so that the second p-type impurity regions 224a and 224b contain an impurity element imparting p-type conductivity at a concentration of about $1\times10^{20}$ atoms/cm$^3$ to $5\times10^{21}$ atoms/cm$^3$. In this embodiment, the third p-type impurity regions 225a and 225b are formed in a self-alignment manner by the sidewall insulating layers 216c and 216d so as to have a lower concentration than the second p-type impurity regions 224a and 224b. In addition, a channel formation region 226 is formed in the single crystal semiconductor layer 206 (see FIG. 6C).

The second p-type impurity regions 224a and 224b are high-concentration p-type impurity regions and serve as a source and a drain. On the other hand, the third p-type impurity regions 225a and 225b are low-concentration impurity regions and serve as LDD (lightly doped drain) regions. Since the third p-type impurity regions 225a and 225b are formed in Loff regions, which are not covered with the gate electrode layer 209, off current can be reduced. Accordingly, a semiconductor device with higher reliability and lower power consumption can be manufactured.

The mask 223 is removed, and heat treatment, irradiation with strong light, or irradiation with a laser beam may be performed in order to activate the impurity element. At the same time as the activation, plasma damage to the gate insulating layer and plasma damage to an interface between the gate insulating layer and the single crystal semiconductor layer can be repaired.

Next, an interlayer insulating layer which covers the gate electrode layers and the gate insulating layers is formed. In this embodiment, a stack of an insulating film 227 containing hydrogen to serve as a protective film and an insulating layer 228 is employed. The insulating film 227 and the insulating layer 228 may be formed using a silicon nitride film, a silicon nitride oxide film, a silicon oxynitride film, or a silicon oxide film by sputtering or plasma CVD. Alternatively, a single layer or a stack of three or more layers using another insulating film containing silicon may also be employed.

Furthermore, a step in which heat treatment is performed at 300° C. to 550° C. for 1 hour to 12 hours in a nitrogen atmosphere to hydrogenate the single crystal semiconductor layer is performed. Preferably, the temperature is 400° C. to 500° C. This step is a step for terminating a dangling bond of the single crystal semiconductor layer by hydrogen contained in the insulating film 227, which is an interlayer insulating layer. In this embodiment, heat treatment is performed at 450° C. for one hour.

The insulating film 227 and the insulating layer 228 can be formed of a material selected from aluminum nitride (AlN), aluminum oxynitride (AlON), aluminum nitride oxide in which the amount of nitrogen is higher than that of oxygen (AlNO), aluminum oxide, diamond-like carbon (DLC), nitrogen-containing carbon (CN), or other substances containing an inorganic insulating material. A siloxane resin may also be used. A siloxane resin is a resin including a Si—O—Si bond. Siloxane has a skeletal structure formed of a bond of silicon (Si) and oxygen (O). As a substituent, an organic group containing at least hydrogen (e.g., an alkyl group or an aryl group) is used. A fluoro group may be included in the organic group. Further, an organic insulating material such as polyimide, acrylic, polyamide, polyimide amide, resist, benzocyclobutene, or polysilazane may also be used. A coating film with favorable planarity, which is formed by a coating method, may also be used.

The insulating film 227 and the insulating layer 228 can be formed with use of dipping, spray coating, a doctor knife, a roll coater, a curtain coater, a knife coater, a CVD method, an evaporation method, or the like. The insulating film 227 and the insulating layer 228 may also be formed by a droplet discharge method. A droplet discharge method requires less material solution. In addition, a method capable of transferring or drawing a pattern such as a droplet discharge method, for example, a printing method (a method of forming a pattern, such as screen printing, offset printing, or the like) can also be used.

Next, contact holes (openings) reaching the single crystal semiconductor layers are formed in the insulating film 227 and the insulating layer 228 using a resist mask. Etching may be performed once or plural times depending on the selectivity of materials to be used. The insulating film 227 and the insulating layer 228 are partly removed by the etching to form the openings reaching the second n-type impurity regions 219a and 219b and the second p-type impurity regions 224a and 224b, which are source regions and drain regions. The etching may be performed by wet etching, dry etching, or both wet etching and dry etching. A hydrofluoric-acid-based solution such as a mixed solution of ammonium hydrogen fluoride and ammonium fluoride may be used as an etchant of wet etching. As an etching gas, a chlorine-based gas typified by $Cl_2$, $BCl_3$, $SiCl_4$, $CCl_4$, or the like, a fluorine-based gas typified by $CF_4$, $SF_6$, $NF_3$, or the like, or $O_2$ can be used as appropriate. Further, an inert gas may be added to an etching gas to be used. As an inert element to be added, one or a plurality of elements selected from He, Ne, Ar, Kr, or Xe can be used.

A conductive film is formed so as to cover the openings, and the conductive film is etched to form wiring layers 229a, 229b, 230a, and 230b which serve as source and drain electrode layers which are electrically connected to parts of source regions and drain regions. The wiring layers can be formed by formation of a conductive film by a PVD method, a CVD method, an evaporation method, or the like, and then, etching the conductive film into a desired shape. Further, a conductive film can be selectively formed in a predetermined position by a droplet discharge method, a printing method, an electroplating method, or the like. Moreover, a reflow process or a damascene process may also be used. As a material for the wiring layers, metal such as Ag, Au, Cu, Ni, Pt, Pd, Ir, Rh, W, Al, Ta, Mo, Cd, Zn, Fe, Ti, Zr, or Ba; Si or Ge; or an alloy or nitride thereof can be used. A stack of these materials may also be employed.

Figure 6D:
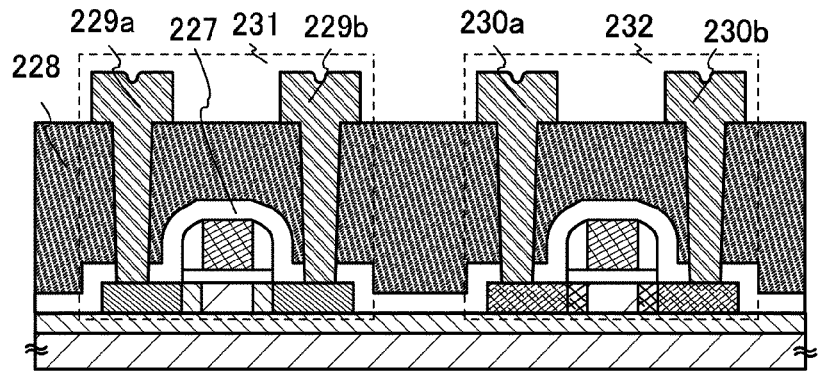

Through the above-described steps, a semiconductor device having a CMOS structure which includes a thin film transistor 231, which is an n-channel thin film transistor, and a thin film transistor 232, which is a p-channel thin film transistor, can be formed (see FIG. 6D). Although not illustrated in the drawings, a CMOS structure is described in this embodiment; thus, the thin film transistor 231 and the thin film transistor 232 are electrically connected to each other.

A structure of the thin film transistor is not limited to that described in this embodiment, and a single gate structure in which one channel formation region is formed, a double gate structure in which two channel formation regions are formed, or a triple gate structure in which three channel formation regions are formed may be employed.

As described above, a semiconductor device which has high performance and high reliability can be manufactured with high yield with use of an SOI substrate in which contamination of a single crystal semiconductor layer due to impurities such as a metal element and the like is suppressed.

Thin film transistors can be manufactured using such an SOI substrate. The single crystal semiconductor layer of the SOI substrate is a single crystal semiconductor layer with reduced crystal defects and with reduced interface state density with the gate insulating layer 207. The single crystal semiconductor layer has a planarized surface and is thinned to a thickness of less than or equal to 60 nm. Accordingly, thin film transistors with excellent characteristics such as low driving voltage, high electron field effect mobility, and a low subthreshold value can be formed over the supporting substrate 121. Furthermore, plural transistors with high performance and less variation in characteristics between the transistors can be formed over the same substrate. In other words, with use of the SOI substrate of the present invention, non-uniformity of the important characteristic value as transistor characteristics, such as threshold voltage or mobility, can be reduced and high performance such as high field effect mobility can be obtained.

Although the method for manufacturing a TFT has been described with reference to FIGS. 5A to 5E and FIGS. 6A to 6D, a semiconductor device can be manufactured so as to have high added value by forming a variety of semiconductor elements such as a capacitor and a resistor, together with the TFT. Hereinafter, specific modes of semiconductor devices will be described with reference to the drawings.

Figure 7:
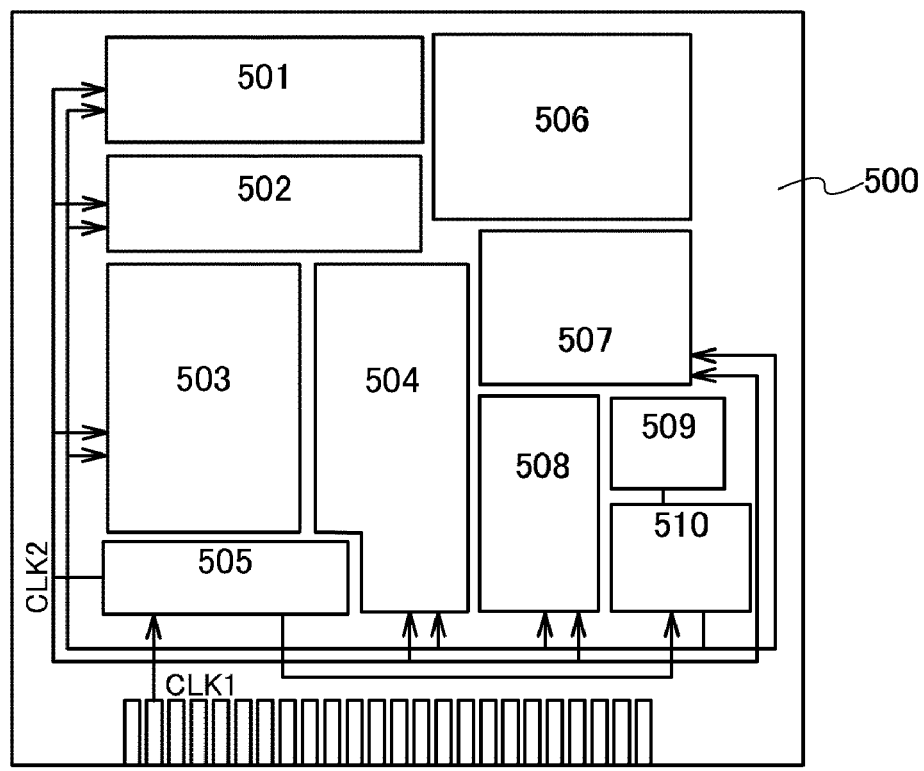
FIG. 7 is a block diagram illustrating a structure of a microprocessor manufactured using an SOI substrate according to an embodiment of the present invention.

First, as an example of a semiconductor device, a microprocessor is described. FIG. 7 is a block diagram illustrating a structural example of a microprocessor 500.

The microprocessor 500 has an arithmetic logic unit (also referred to as an ALU) 501, an ALU controller 502, an instruction decoder 503, an interrupt controller 504, a timing controller 505, a register 506, a register controller 507, a bus interface (Bus I/F) 508, a read only memory 509, and a memory interface 510.

An instruction input to the microprocessor 500 through the bus interface 508 is input to the instruction decoder 503 and decoded. Then, the instruction is input to the ALU controller 502, the interrupt controller 504, the register controller 507, and the timing controller 505. The ALU controller 502, the interrupt controller 504, the register controller 507, and the timing controller 505 perform various controls based on the decoded instruction.

Specifically, the ALU controller 502 generates a signal for controlling operation of the arithmetic logic unit 501. While the microprocessor 500 is executing a program, the interrupt controller 504 judges an interrupt request from an external input and output device or a peripheral circuit based on its priority or a mask state, and processes the interrupt request. The register controller 507 generates an address of the register 506, and reads/writes data from/to the register 506 in accordance with the state of the microprocessor 500. The timing controller 505 generates signals for controlling timing of operation of the arithmetic logic unit 501, the ALU controller 502, the instruction decoder 503, the interrupt controller 504, and the register controller 507. For example, the timing controller 505 is provided with an internal clock generator for generating an internal clock signal CLK2 based on a reference clock signal CLK1. As illustrated in FIG. 7, the internal clock signal CLK2 is input to other circuits.

Figure 8:
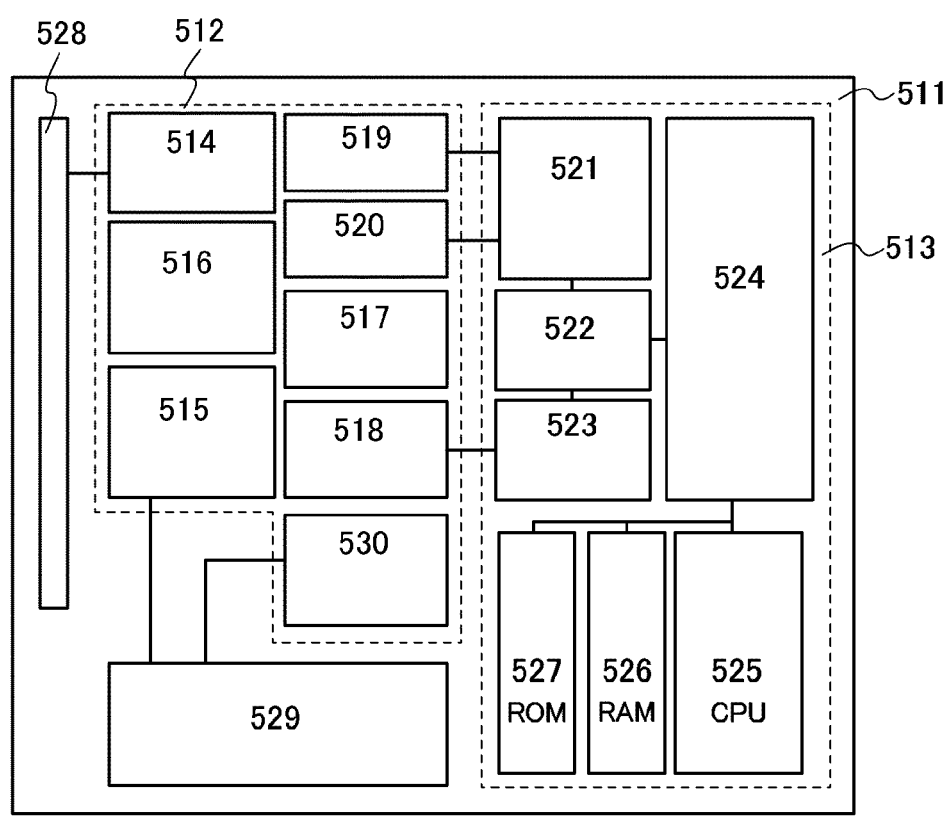
FIG. 8 is a block diagram illustrating a structure of a microprocessor manufactured using an SOI substrate according to an embodiment of the present invention.

Next, an example of a semiconductor device having a function of transmitting and receiving data without contact and also having an arithmetic function will be described. FIG. 8 is a block diagram illustrating a structural example of such a semiconductor device. The semiconductor device illustrated in FIG. 8 can be called a computer which operates to transmit and receive signals to and from an external device through wireless communication (hereinafter the computer is referred to as an RFCPU).

As illustrated in FIG. 8, an RFCPU 511 includes an analog circuit portion 512 and a digital circuit portion 513. The analog circuit portion 512 includes a resonance circuit 514 having a resonant capacitor, a rectifier circuit 515, a constant voltage circuit 516, a reset circuit 517, an oscillator circuit 518, a demodulation circuit 519, and a modulation circuit 520. The digital circuit portion 513 includes an RF interface 521, a control register 522, a clock controller 523, an interface 524, a central processing unit 525, a random access memory 526, and a read only memory 527.

The operation of the RFCPU 511 is roughly described below. The resonance circuit 514 generates induced electromotive force based on a signal received at an antenna 528. The induced electromotive force is stored in a capacitor portion 529 via the rectifier circuit 515. The capacitor portion 529 is preferably formed using a capacitor such as a ceramic capacitor or an electric double layer capacitor. The capacitor portion 529 is not necessarily integrated over the same substrate as the RFCPU 511 and may be incorporated into the RFCPU 511 as a component.

The reset circuit 517 generates a signal that resets the digital circuit portion 513 to be initialized. For example, a signal which rises with a delay to a rise of the power supply voltage is generated as a reset signal. The oscillator circuit 518 changes the frequency and the duty ratio of a clock signal in accordance with a control signal generated by the constant voltage circuit 516. The demodulation circuit 519 demodulates a received signal, and the modulation circuit 520 modulates data to be transmitted.

For example, the demodulation circuit 519 is formed using a low-pass filter and binarizes a received signal of an amplitude shift keying (ASK) system based on variation of the amplitude. The modulation circuit 520 transmits transmission data by changing the amplitude of a transmission signal of the amplitude shift keying (ASK) system. The modulation circuit 520 changes the resonance point of the resonance circuit 514, whereby the amplitude of a communication signal is changed.

The clock controller 523 generates a control signal for changing the frequency and the duty ratio of the clock signal in accordance with the power supply voltage or current consumption in the central processing unit 525. The power supply voltage is monitored by a power supply control circuit 530.

A signal that is input to the RFCPU 511 from the antenna 528 is demodulated by the demodulation circuit 519, and then divided into a control command, data, and the like by the RF interface 521. The control command is stored in the control register 522. The control command includes reading of data stored in the read only memory 527, writing of data to the random access memory 526, an arithmetic instruction to the central processing unit 525, and the like.

The central processing unit 525 accesses the read only memory 527, the random access memory 526, and the control register 522 via the interface 524. The interface 524 has a function of generating an access signal for any of the read only memory 527, the random access memory 526, and the control register 522 based on an address requested by the central processing unit 525.

As an arithmetic method of the central processing unit 525, a method may be employed in which the read only memory 527 stores an operating system (OS) and a program is read at the time of starting operation and then executed. Alternatively, a method in which a circuit dedicated to arithmetic is formed and an arithmetic processing is conducted using hardware may be employed. In a method in which both hardware and software are used, part of arithmetic processing can be conducted by a circuit dedicated to arithmetic, and the other part of the arithmetic processing can be conducted by the central processing unit 525 using a program.

Next, display devices are described with reference to FIGS. 9A and 9B and FIGS. 10A and 10B.

Figure 9A:
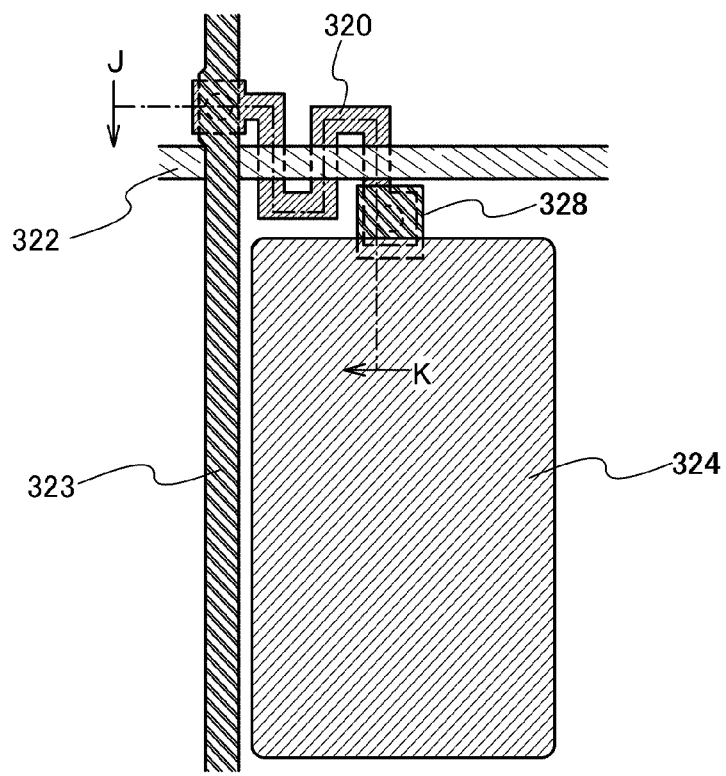
FIG. 9A is a plan view illustrating a pixel of a liquid crystal display device and FIG. 9B is a cross-sectional view taken along line J-K of FIG. 9A.
Figure 9B:
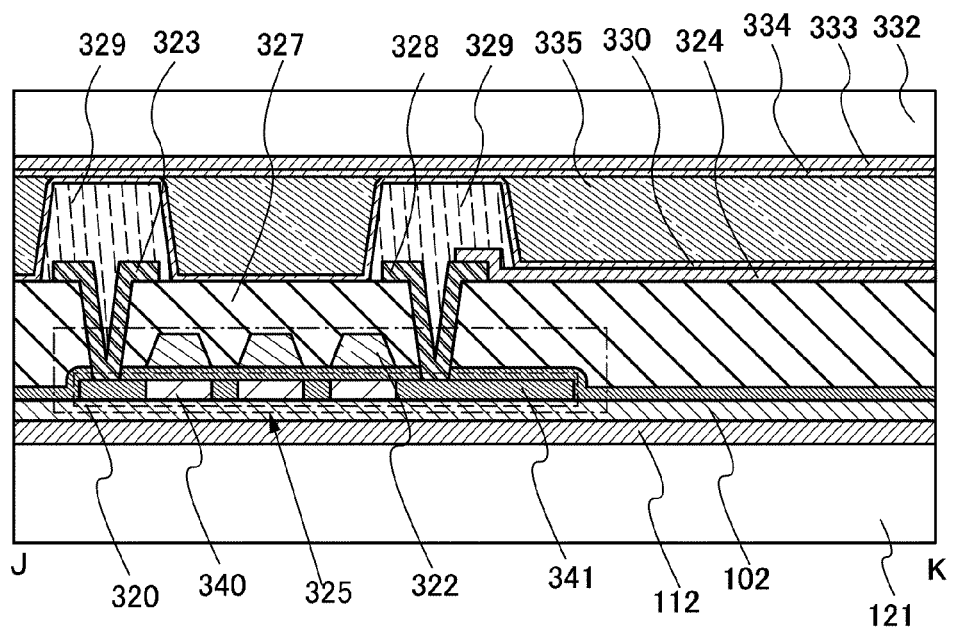

FIGS. 9A and 9B are drawings for describing a liquid crystal display device. FIG. 9A is a plan view of a pixel of the liquid crystal display device, and FIG. 9B is a cross-sectional view taken along a section line J-K of FIG. 9A.

As illustrated in FIG. 9A, the pixel includes a single crystal semiconductor layer 320, a scan line 322 intersecting with the single crystal semiconductor layer 320, a signal line 323 intersecting with the scan line 322, a pixel electrode 324, and an electrode 328 which electrically connects the pixel electrode 324 to the single crystal semiconductor layer 320. The single crystal semiconductor layer 320 is a layer formed of the single crystal semiconductor layer provided over the supporting substrate 121 and is included in a TFT 325 of the pixel.

As an SOI substrate, the SOI substrate described in the above embodiment is used. As illustrated in FIG. 9B, the single crystal semiconductor layer 320 is stacked over the supporting substrate 121 with the oxide film 102 and the insulating layer 122 interposed therebetween. As the supporting substrate 121, a glass substrate can be used. The single crystal semiconductor layer 320 of the TFT 325 is formed by element isolation of the single crystal semiconductor layer of the SOI substrate by etching. In the single crystal semiconductor layer 320, channel formation regions 340 and n-type high-concentration impurity regions 341 to which an impurity element is added are formed. A gate electrode of the TFT 325 is included in the scan line 322, and one of a source electrode and a drain electrode is included in the signal line 323.

Over an interlayer insulating film 327, the signal line 323, the pixel electrode 324, and the electrode 328 are provided. Over the interlayer insulating film 327, columnar spacers 329 are formed. An orientation film 330 is formed to cover the signal line 323, the pixel electrode 324, the electrode 328, and the columnar spacers 329. On a counter substrate 332, a counter electrode 333 and an orientation film 334 which covers the counter electrode 333 are formed. The columnar spacers 329 are formed to maintain a space between the supporting substrate 121 and the counter substrate 332. In the space formed by the columnar spacers 329, a liquid crystal layer 335 is formed. At connection portions of the signal line 323 and the electrode 328 with the high-concentration impurity regions 341, there are steps formed in the interlayer insulating film 327 due to formation of contact holes; thus, orientation of liquid crystal in the liquid crystal layer 335 in these connection portions becomes disordered easily. Accordingly, the columnar spacers 329 are formed in these step portions to prevent orientation disorder of liquid crystal.

Figure 10A:
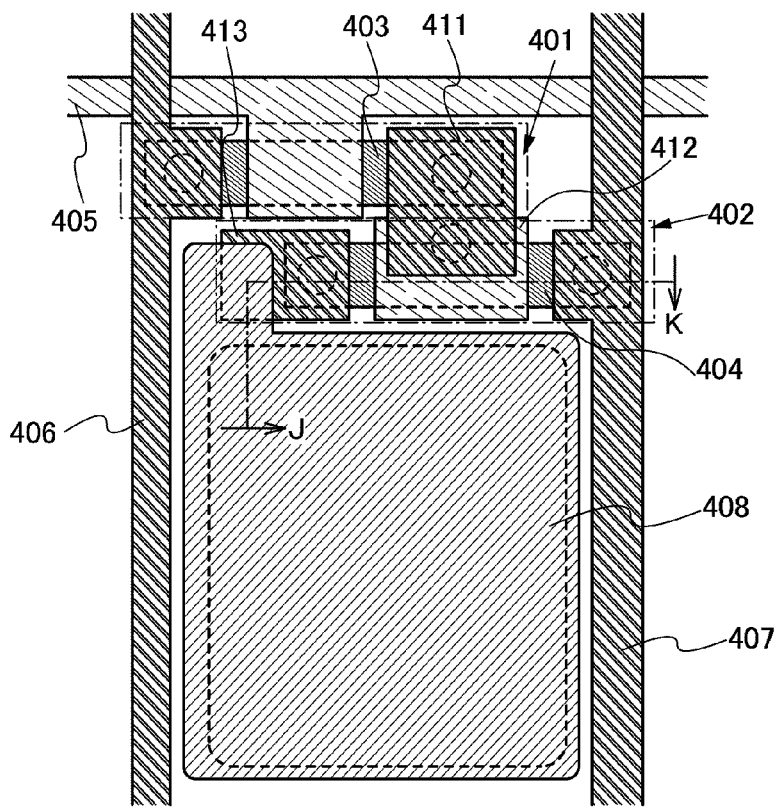
FIG. 10A is a plan view illustrating a pixel of an electroluminescence display device and FIG. 10B is a cross-sectional view taken along line J-K of FIG. 10A.
Figure 10B:
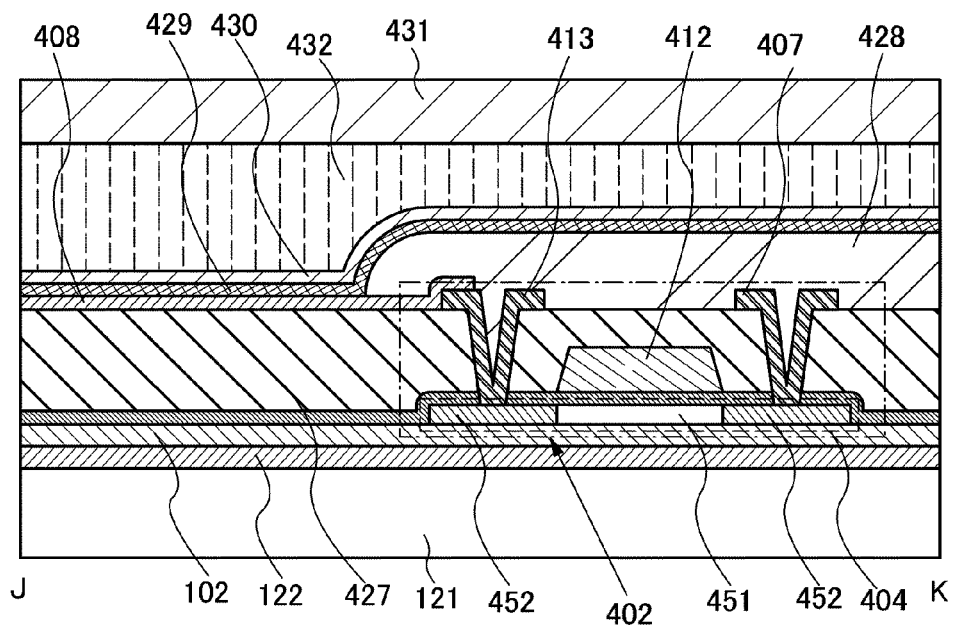

Next, an electroluminescent display device (hereinafter referred to as an "EL display device") is described with reference to FIGS. 10A and 10B. FIG. 10A is a plan view of a pixel of the EL display device, and FIG. 10B is a cross-sectional view taken along a section line J-K of FIG. 10A.

As illustrated in FIG. 10A, the pixel includes a selecting transistor 401 and a display control transistor 402 that are TFTs, a scan line 405, a signal line 406, a current supply line 407, and a pixel electrode 408. Each pixel is provided with a light emitting element having a structure in which a layer containing an electroluminescent material (EL layer) is interposed between a pair of electrodes. One of the electrodes of the light emitting element is the pixel electrode 408. In a single crystal semiconductor layer 403, a channel formation region, a source region, and a drain region of the selecting transistor 401 are formed. In a single crystal semiconductor layer 404, a channel formation region, a source region, and a drain region of the display control transistor 402 are formed. The single crystal semiconductor layers 403 and 404 are formed using the single crystal semiconductor layer that is provided over the supporting substrate.

In the selecting transistor 401, a gate electrode is included in the scan line 405; one of a source electrode and a drain electrode is included in the signal line 406; and the other is formed as an electrode 410. In the display control transistor 402, a gate electrode 412 is electrically connected to the electrode 411; one of a source electrode and a drain electrode is formed as an electrode 413 which is electrically connected to the pixel electrode 408; and the other is included in the current supply line 407.

The display control transistor 402 is a p-channel TFT. As illustrated in FIG. 10B, in the single crystal semiconductor layer 404, a channel formation region 451 and p-type high-concentration impurity regions 452 are formed. Note that, as the SOI substrate, the SOI substrate manufactured in any of Embodiments 1 and 2 is used.

An interlayer insulating film 427 is formed to cover the gate electrode 412 of the display control transistor 402. Over the interlayer insulating film 427, the signal line 406, the current supply line 407, the electrodes 411 and 413, and the like are formed. In addition, over the interlayer insulating film 427, the pixel electrode 408 that is electrically connected to the electrode 413 is formed. A peripheral portion of the pixel electrode 408 is surrounded by an insulating partition layer 428. An EL layer 429 is formed over the pixel electrode 408, and a counter electrode 430 is formed over the EL layer 429. A counter substrate 431 is provided as a reinforcing plate, and the counter substrate 431 is fixed to the supporting substrate 121 with a resin layer 432.

The grayscale of the EL display device is controlled by either a current drive method where the luminance of the light-emitting element is controlled by the amount of current or a voltage drive method where the luminance is controlled by the amount of voltage. The current drive method is difficult to employ when transistors have characteristics which largely vary from pixel to pixel. In order to employ the current drive method, a correction circuit which corrects characteristic variation is needed. When the EL display device is manufactured by a manufacturing method including a manufacturing process of an SOI substrate, the selecting transistor 401 and the display control transistor 402 do not have variation in characteristics from pixel to pixel. Accordingly, the current drive method can be employed.

That is, various electronic devices can be manufactured by using SOI substrates. Examples of electronic devices include: cameras such as video cameras and digital cameras; navigation systems; sound reproduction devices (car audio systems, audio components, and the like); computers; game machines; portable information terminals (mobile computers, cellular phones, portable game machines, electronic book readers, and the like); image reproduction devices provided with recording media (specifically, devices which are each capable of reproducing audio data stored in a recording medium such as a digital versatile disc (DVD) and which each have a display device capable of displaying image data stored therein); and the like. Examples of them are illustrated in FIGS. 11A to 11F and FIGS. 12A to 12C.

Figure 11A:
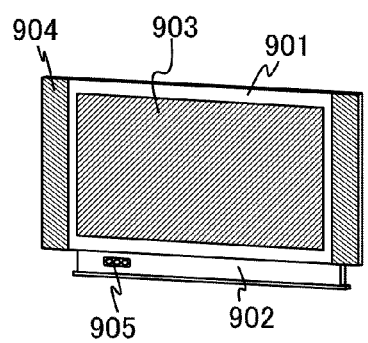
FIGS. 11A to 11F are views each illustrating an electronic device according to an embodiment of the present invention.

FIG. 11A illustrates a display device which includes a housing 901, a supporting base 902, a display portion 903, a speaker portion 904, a video input terminal 905, and the like. This display device is manufactured using the transistors formed by the manufacturing method described in the other embodiment for a driver IC, the display portion 903, and the like. Note that the display device refers to a liquid crystal display device, a light-emitting display device, and the like, and all the information display devices for, for example, computers, television reception, and advertisement display can be included. Specifically, a display, a head-mounted display, a reflection type projector, and the like can be given.

Figure 11B:
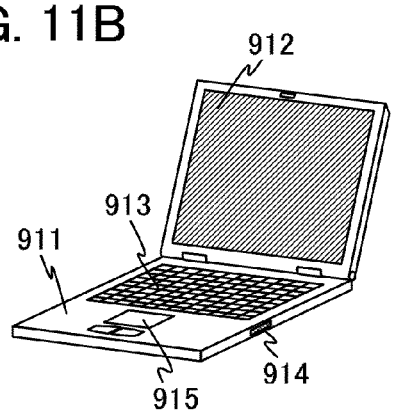

FIG. 11B illustrates a computer which includes a housing 911, a display portion 912, a keyboard 913, an external connection port 914, a pointing device 915, and the like. A transistor formed according to the present invention can be applied not only to a pixel portion in the display portion 912 but also to a semiconductor device such as a driver IC for display, a CPU inside a main body, or a memory.

Figure 11C:
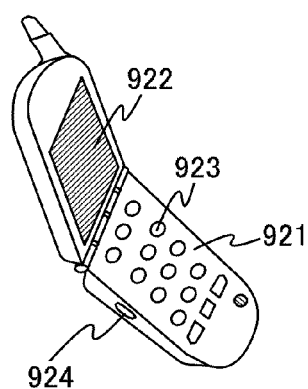

FIG. 11C illustrates a cellular phone, which is a typical example of a portable information processing terminals. This cellular phone includes a housing 921, a display portion 922, an operation key 923, and the like. A transistor formed using the SOI substrate according to the present invention can be applied not only to a pixel portion in the display portion 922 or a sensor portion 924, but also to a driver IC for display, a memory, an audio processing circuit, and the like. The sensor portion 924 includes an optical sensor element, by which the luminance of the display portion 922 is controlled based on the luminance obtained by the sensor portion 924, and the brightness of the operation keys 923 is controlled based on the luminance obtained by the sensor portion 924. Thus, the power consumption of the cellular phone can be suppressed.

A transistor formed according to the present invention can be used for electronic devices such as a PDA (a personal digital assistant or a portable information processing terminals), a digital camera, a compact game machine, or a portable audio playback device, in addition to the above cellular phone. For example, it is possible to apply the transistor according to the present invention to a functional circuit such as a CPU, a memory, or a sensor or to a pixel portion of such an electronic device or a driver IC for display.

Figure 11D:
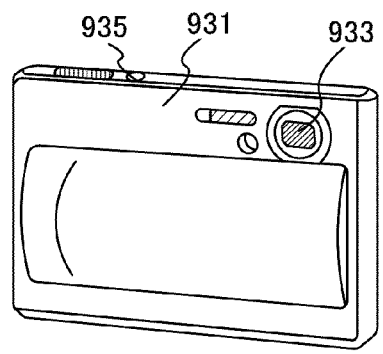
Figure 11E:
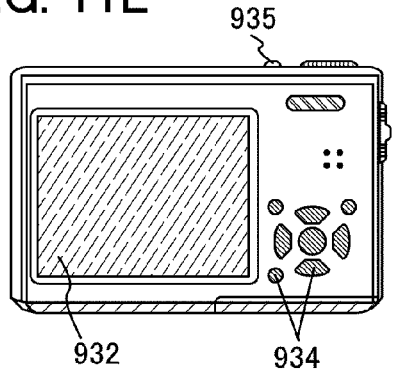

FIGS. 11D and 11E illustrate a digital camera. Note that FIG. 11E illustrates a rear side of the digital camera illustrated in FIG. 11D. This digital camera includes a housing 931, a display portion 932, a lens 933, an operation key 934, a shutter button 935, and the like. A transistor formed according to the present invention can be applied to a pixel portion in the display portion 932, a driver IC for driving the display portion 932, a memory, and the like.

Figure 11F:
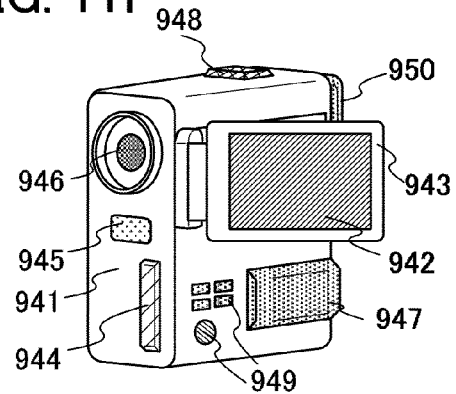

FIG. 11F shows a digital video camera. This digital video camera includes a main body 941, a display portion 942, a housing 943, an external connection port 944, a remote control receiving portion 945, an image receiving portion 946, a battery 947, an audio input portion 948, an operation key 949, an eye piece portion 950, and the like. A transistor formed according to the present invention can be applied to a pixel portion in the display portion 942, a driver IC for driving the display portion 942, a memory, a digital input processing device, and the like.

Besides, the present invention can be applied to a navigation system, an audio playback device, an image reproducing device provided with a recording medium, and the like. A transistor manufactured according to the present invention can be applied to a pixel portion in a display portion, a driver IC for controlling the display portion, a memory, a digital input processing device, a sensor portion, and the like of those devices.

Figure 12A:
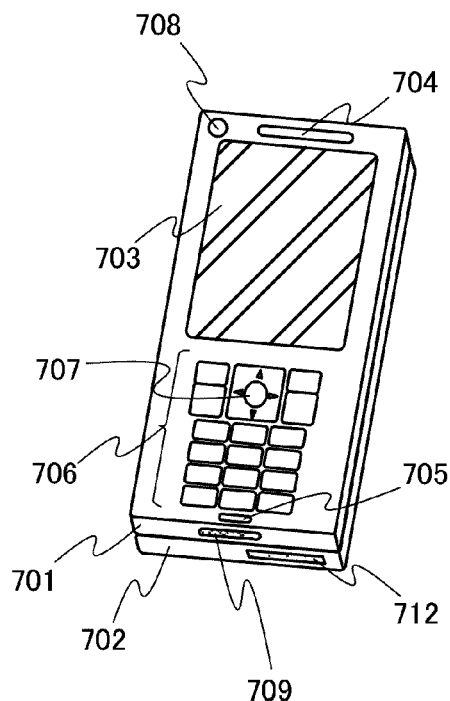
FIGS. 12A to 12C are views illustrating an electronic device according to an embodiment of the present invention.
Figure 12B:
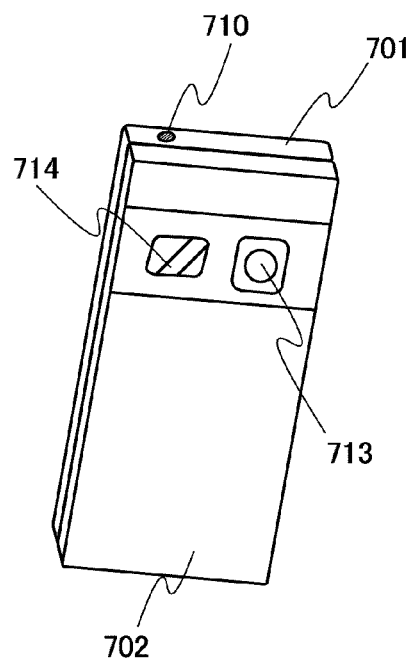
Figure 12C:
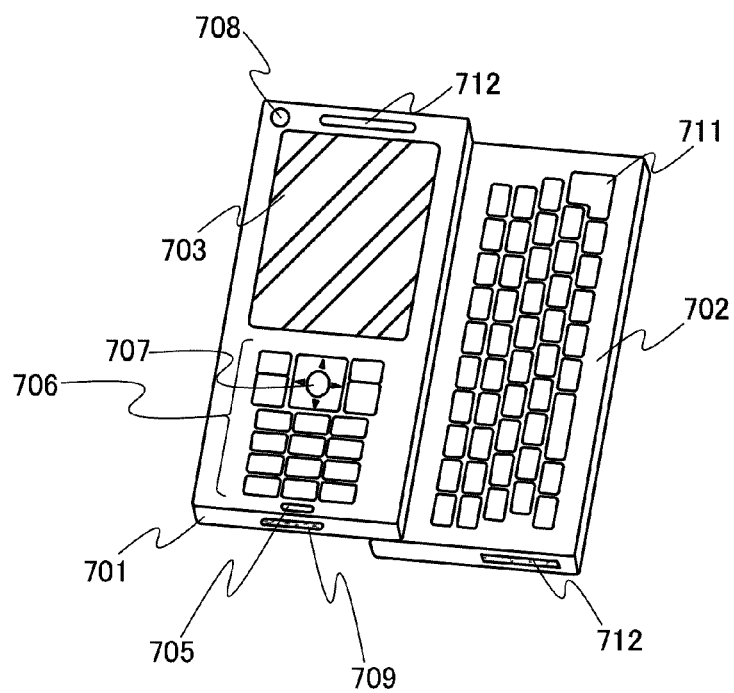

FIGS. 12A to 12C illustrate an example of a cellular phone to which the present invention is applied. FIG. 12A is a front view, FIG. 12B is a rear view, and FIG. 12C is a front view in which two housings are slid. A cellular phone 700 has two housings, a housing 701 and a housing 702. The cellular phone 700 is a so-called smartphone that has both a function as a cellular phone and a function as a portable information terminal and incorporates a computer provided to conduct a variety of data processing besides voice calls.

The cellular phone 700 has the housings 701 and 702. The housing 701 includes a display portion 703, a speaker 704, a microphone 705, operation keys 706, a pointing device 707, a front-face camera lens 708, an external connection terminal jack 709, an earphone terminal 710, and the like. The housing 702 includes a keyboard 711, an external memory slot 712, a rear-face camera 713, a light 714, and the like. In addition, an antenna is incorporated in the housing 701.

Further, in addition to the above-described components, the cellular phone 700 may incorporate a contactless IC chip, a small size memory device, or the like.

The housings 701 and 702 which overlap with each other (see FIG. 12A) can be slid to be developed as illustrated in FIG. 12C. The display portion 703 can incorporate a display panel or a display device to which the method for manufacturing the display device described in any of Embodiments 2 and 3 is applied. Because the display portion 703 and the front-face camera lens 708 are provided in the same plane, the cellular phone can be used as a videophone. In addition, still images and moving images can be taken with the rear-face camera 713 and the light 714 by using the display portion 703 as a viewfinder.

With the use of the speaker 704 and the microphone 705, the cellular phone 700 can be used as a sound recording device (recorder) or a sound reproducing device. By operation with the operation keys 706, operation of incoming and outgoing calls, simple information input for electronic mail or the like, scrolling of a viewing area displayed on the display portion, cursor motion for selecting information displayed on the display portion, and the like are possible.

If much information needs to be handled in documentation, a use as a portable information terminal, and the like, the use of the keyboard 711 is convenient. Further, the housings 701 and 702 which overlap with each other (FIG. 12A) can be developed by sliding as illustrated in FIG. 12C. When the cellular phone is used as a portable information terminal, smooth cursor operation can be conducted using the keyboard 711 or the pointing device 707. The external connection terminal jack 709 can be connected to an AC adaptor and various types of cables such as a USB cable, and charging and data communication with a personal computer or the like are possible. Further, by inserting a recording medium into the external memory slot 712, a larger amount of data can be stored and transferred.

The housing 702 is provided with the rear-face camera 713 and the light 714 on the rear face (FIG. 12B), and still images and moving images can be taken using the display portion 703 as a viewfinder.

Furthermore, in addition to the above-described functions, the cellular phone may also have an infrared communication function, a USB port, a television one-segment broadcasting receiving function, a contactless IC chip, an earphone jack, or the like.

The electronic devices described with reference to FIGS. 11A to 11C can be manufactured by the above method for manufacturing a transistor and a display device.

EXAMPLE 1

Hereinafter, examples of the present invention will be described in more detail. However, the present invention is not limited by these examples, and it is obvious that the present invention is specified by the scope of claims. In this example, surface roughness of a semiconductor substrate will be described.

A single crystal silicon substrate is prepared as a semiconductor substrate. The single crystal silicon substrate is a p-type silicon substrate of 5 inches in diameter, and the plane orientation thereof is (100) and the side orientation thereof is <100>.

Etching was performed on a surface of the single crystal silicon substrate. The etching of the single crystal silicon substrate was performed with a parallel plate plasma CVD apparatus under the following conditions: the RF power: 50 W (13.56 MHz), the pressure in the process chamber: 65 Pa, the distance between electrodes: 30 mm, the temperature of the substrate: 200° C., the flow ratio of the reaction gas: $NF_3:N_2=10:400$ sccm, and the treatment time: 30 seconds (which enables etching of the single crystal silicon substrate by about 30 nm).

Next, the surface roughness of the single crystal silicon substrate after etching was measured.

The surface roughness of the single crystal silicon substrate and the crystallinity thereof can be analyzed by observation with an optical microscope, an atomic force microscope (AFM), and a scanning electron microscope (SEM), by observation of an electron back scatter diffraction pattern (EBSP), by Raman spectroscopy, or the like.

In this embodiment, for the measurement of the surface roughness of the silicon layer, the mean surface roughness (Ra) of the single crystal silicon substrate, the root-mean-square surface roughness (RMS) thereof, and the maximum difference in height between peak and valley (P–V) thereof were measured with an atomic force microscope (AFM).

In this embodiment, the mean surface roughness (Ra) refers to a mean surface roughness obtained by three-dimensional expansion of a centerline mean roughness (Ra) that is defined by JISB0601:2001 (ISO4287:1997) so as to be able to be applied to a measurement surface. The Ra can be represented by a mean value of the absolute values of the deviation from a reference surface to a specified surface, and is calculated by the formula below.

$$R_a = \frac{1}{S_0} \int_{Y_1}^{Y_2} \int_{X_1}^{X_2} |F(X, Y) - Z_0| dX dY \qquad \text{[Formula 1]}$$

Note that the measurement surface refers to a surface shown by all measurement data and is calculated by the formula below.

$$Z = F(X, Y) \qquad \text{[Formula 2]}$$

The specified surface refers to a surface which is an object of roughness measurement, and a rectangular region surrounded by four points represented by the coordinates $(X_1, Y_1)$, $(X_1, Y_2)$, $(X_2, Y_1)$, and $(X_2, Y_2)$. The area of the specified surface when the specified surface is ideally flat is represented by $S_0$. Note that $S_0$ is obtained by the formula below.

$$S_0 = (X_2 - X_1) \cdot (Y_2 - Y_1) \qquad \text{[Formula 3]}$$

The reference surface refers to a plane surface represented by $Z = Z_0$ when the mean value of the height of the specified surface is represented by $Z_0$. The reference surface is parallel to the XY plane. Note that $Z_0$ can be obtained by the formula below.

$$Z_0 = \frac{1}{S_0} \int_{Y_1}^{Y_2} \int_{X_1}^{X_2} F(X, Y) dX dY \qquad \text{[Formula 4]}$$

The root-mean-square surface roughness (RMS) refers to a root-mean-square surface roughness obtained by three-dimensional expansion of the RMS of a cross section curve so as to be able to be applied to the measurement surface, similarly to the mean surface roughness (Ra). The RMS can be represented by the square root of the mean value of the square of the deviation from the reference surface to the specified surface, and is obtained by the formula below.

$$R_{ms} = \sqrt{\frac{1}{S_0} \int_{Y_1}^{Y_2} \int_{X_1}^{X_2} \{F(X, Y) - Z_0\}^2 dX dY} \qquad \text{[Formula 5]}$$

The maximum difference in height between peak and valley (P–V) can be represented by a difference between the height of the highest peak $Z_{max}$ and the height of the lowest valley $Z_{min}$, in the specified surface, and is obtained by the formula below.

$$P - V = Z_{max} - Z_{min} \qquad \text{[Formula 6]}$$

The peak and the valley in this embodiment refer to a peak and a valley obtained by three-dimensional expansion of the "peak" and the "valley" defined by JISB0601:2001 (ISO4287:1997). The peak is represented by the highest part of the peaks in the specified surface. The valley is represented by the lowest part of the valleys in the specified surface.

The measurement conditions of the mean surface roughness (Ra), the root-mean-square surface roughness (RMS), and the maximum difference in height between peak and valley (P–V) in this embodiment are described below.

Atomic force microscope (AFM): scanning probe microscope SPI3800N/SPA500 (manufactured by Seiko Instruments Inc.)
Measurement mode: dynamic force mode (DFM mode)
Cantilever: SI-DF40 (made of silicon, spring constant of 42 N/m, resonance frequency of 250 kHz to 390 kHz inclusive, edge of probe R≦10 nm)
Scanning speed: 1.0 Hz
Measurement area: 1×1 μm
Measurement point: 256×256 points Note that DMF mode is a measurement mode in which a surface shape is measured while the distance between a probe and a sample is controlled with a cantilever resonated at a certain frequency (a frequency peculiar to the cantilever) so that the oscillation amplitude of the lever becomes constant. Since the surface of the sample is measured without contact in this DFM mode, the measurement can be carried out while maintaining the original shape without damaging the surface of the sample.

In this example, the surface roughness of three points (see FIG. 13A) on the surface of the single crystal silicon substrate was measured under the above-described conditions, so that images of three-dimensional surface shapes were obtained. In consideration of the curvature of a cross section of a substrate of each obtained measured image, all the data of the images were fitted for one-dimensional plane by a least-squares method with attached software to perform the first gradient correction for correcting the gradient in the plane, followed by the second gradient correction for correcting the quadratic curve, which was performed in a similar manner to the first gradient correction. After that, the surface roughness was analyzed with the attached software, so that each of the mean surface roughness (Ra), the root-mean-square surface roughness (RMS), and the maximum difference in height between peak and valley (P–V) was calculated.

Figure 13D:
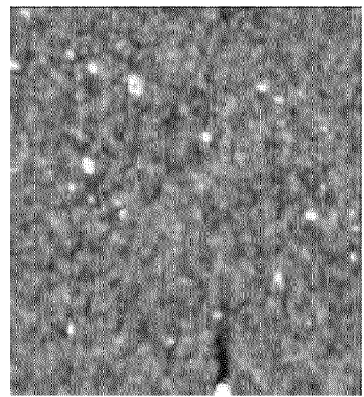
FIGS. 13A to 13D are AFM images of a single crystal silicon substrate observed by AFM.
Figure 13C:
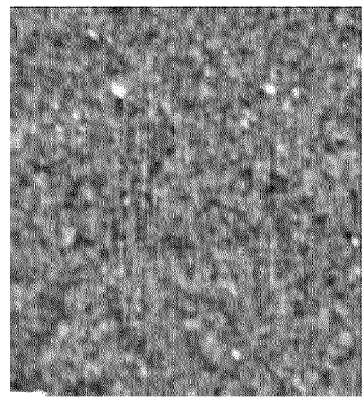
Figure 13A:
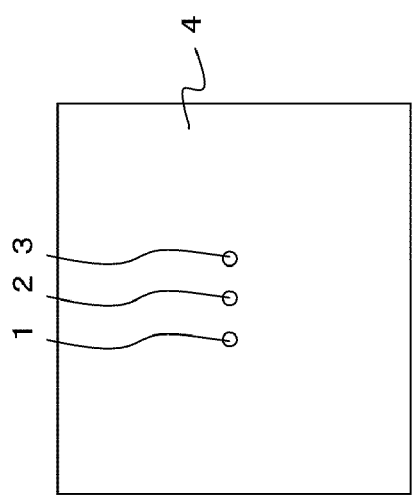
Figure 13B:
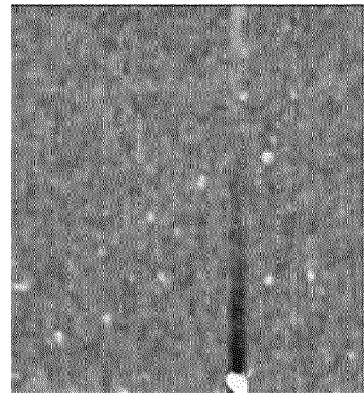

FIGS. 13B to 13D show results of measurement with AFM. FIG. 13B, FIG. 13C, and FIG. 13D are an observation image of a point 1 in FIG. 13A, an observation image of a point 2 in FIG. 13A, and an observation image of a point 3 in FIG. 13A, respectively.

The surface roughness calculated according to the observation images of FIGS. 13B to 13D is shown in Table 1.

TABLE 1

|  | Ra[nm] | P – V[nm] | RMS[nm] |
| --- | --- | --- | --- |
| point 1 | 0.1101 | 2.839 | 0.1452 |
| point 2 | 0.1204 | 4.011 | 0.1701 |
| point 3 | 0.143 | 8.807 | 0.2797 |
| average of points 1 to 3 | 0.125 | 5.219 | 0.198 |

For comparison, surface roughness of a single crystal silicon substrate on which etching was not performed is shown in Table 2. Note that the surface roughness of the single crystal silicon substrate on which etching was not performed was measured at three points which are similar to those of the single crystal silicon substrate on which etching was performed (see FIG. 13A).

TABLE 2

|  | Ra[nm] | P – V[nm] | RMS[nm] |
| --- | --- | --- | --- |
| point 1 | 0.139 | 1.482 | 0.174 |
| point 2 | 0.135 | 1.490 | 0.170 |
| point 3 | 0.137 | 1.554 | 0.172 |
| average of points 1 to 3 | 0.137 | 1.509 | 0.172 |

From the above results, it was found that the surface roughness Ra and the root-mean-square roughness RMS of the single crystal silicon substrate on which etching was performed were not inferior to those of the single crystal silicon substrate on which etching was not performed.

Next, comparison results of gate withstand voltage of a MOS capacitor structure will be described.

Figure 14A:
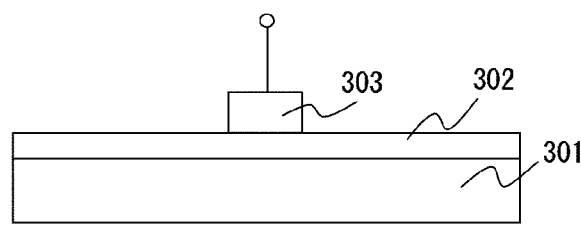
FIG. 14A is a view illustrating a MOS capacitor structure and FIG. 14B is a graph showing characteristics of gate withstand voltages.

FIG. 14A illustrates a MOS capacitor structure used in this example. In the MOS capacitor structure, an insulating film 302 is formed using a silicon oxynitride film over a single crystal silicon substrate 301, and a gate electrode 303 is formed using aluminum over the insulating film 302.

The MOS capacitor having the above structure was manufactured under the following three conditions. Condition 1 is as follows: after a gate insulating film was formed using a silicon oxynitride film to a thickness of 20 nm over a single crystal silicon substrate, a gate electrode was formed using aluminum to a thickness of 400 nm (electrode area: 0.785 mm$^2$).

Condition 2 is as follows: after etching was performed on the single crystal silicon substrate using an ICP etching apparatus with a substrate bias applied under the following conditions: the flow rate of a chlorine gas: 100 sccm, the reaction pressure: 1.2 Pa, the temperature of the lower electrode: 70° C., the RF (13.56 MHz) power applied to the coil electrode: 150 W, and the power applied to the lower electrode (on the bias side): 40 W, a gate insulating film was formed using a silicon oxynitride film over the single crystal silicon substrate to a thickness of 20 nm, and a gate electrode was formed using aluminum to a thickness of 400 nm (electrode area: 0.785 mm$^2$).

Condition 3 is as follows: after etching was performed on the single crystal silicon substrate using a plasma CVD apparatus with no substrate bias applied under the following conditions: the flow ratio of a reaction gas: $NF_3:N_2=10:400$ (sccm), the pressure in the process chamber: 65 Pa, the distance between electrodes: 30 mm, the temperature of the substrate: 200° C., and the RF (13.56 MHz) power: 50 W, a gate insulating film was formed using a silicon oxynitride film over the single crystal silicon substrate to a thickness of 20 nm and a gate electrode was formed using aluminum to a thickness of 400 nm (electrode area: 0.785 mm$^2$).

A sample manufactured under Condition 1 is referred to as Sample A, a sample manufactured under Condition 2 is referred to as Sample B, and a sample manufactured under Condition 3 is referred to as Sample C.

Figure 14B:
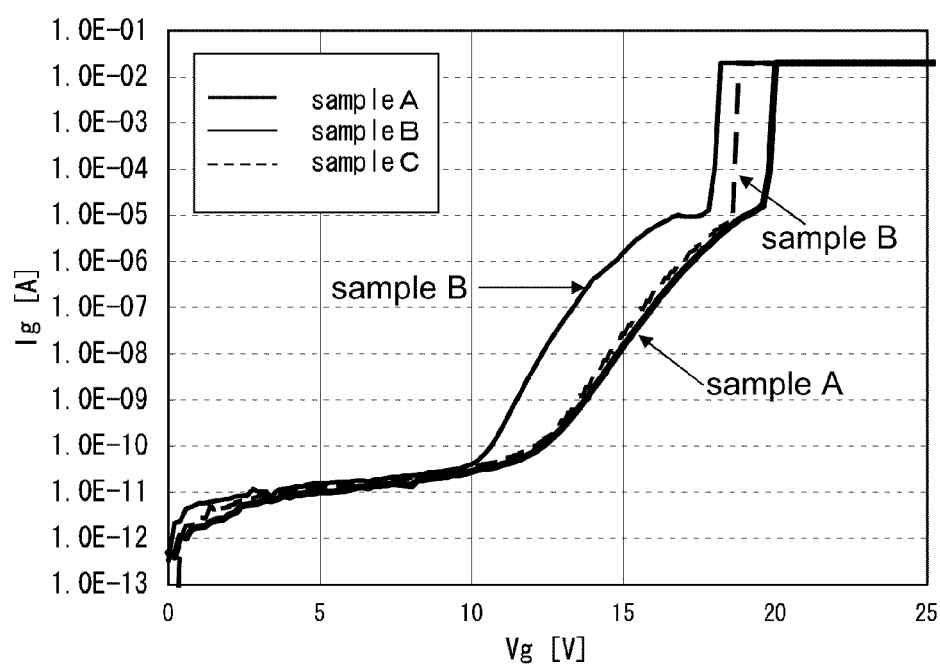

FIG. 14B shows results obtained by measuring the current-voltage (I-V) characteristics of Samples A to C. In FIG. 14B, the horizontal axis indicates a voltage Vg (V) and the vertical axis indicates a current Ig (A). Here, results obtained by measuring I-V characteristics at each point on the surfaces of the substrates of Samples A to C are shown.

It was confirmed from the results shown in FIG. 14B that the rise of a current value is earlier and the withstand voltage is poorer in Sample B on which etching was performed with a substrate bias applied than in Sample A on which etching was not performed. On the other hand, the withstand voltage of Sample C on which etching was performed with no substrate bias applied was the same or substantially the same as that of Sample A on which etching was not performed.

Next, in order to investigate impurities (here, Al) in a single crystal silicon substrate, analysis was performed using secondary ion mass spectrometry (SIMS).

Samples which were used in SIMS will be described. As Condition 1, a single crystal silicon substrate was prepared. As Condition 2, etching was performed on a single crystal silicon substrate using a plasma CVD apparatus with no substrate bias applied under the following conditions: the flow ratio of a reaction gas: $NF_3:N_2=10:400$ (sccm), the pressure in the process chamber: 65 Pa, the distance between electrodes: 30 mm, the temperature of the substrate: 200° C., and the RF (13.56 MHz) power: 50 W. As Condition 3, etching was performed on a single crystal silicon substrate using an ICP etching apparatus with a substrate bias applied under the following conditions: the flow rate of a chlorine gas: 100 sccm, the reaction pressure: 1.5 Pa, the temperature of the lower electrode: 40° C., the RF (13.56 MHz) power which is supplied to a coil-electrode: 1000 W, and the power which is supplied to a lower electrode (on the bias side): 50W. As Condition 4, in a manner similar to Condition 3, etching was performed on a single crystal silicon substrate with a substrate bias applied, and after that, cycle cleaning in which ozone water and hydrofluoric acid were alternately used was performed. A sample manufactured under Condition 1, a sample manufactured under Condition 2, a sample manufactured under Condition 3, and a sample manufactured under Condition 4 were referred to as Sample D, Sample E, Sample F, and Sample G, respectively. Note that in SIMS, absorbed impurities from an outer atmosphere were detected on the outermost surfaces of the samples. Therefore, a silicon oxynitride film was deposited to a thickness of 20 nm in order to protect each surface of Samples D to G.

Figure 15:
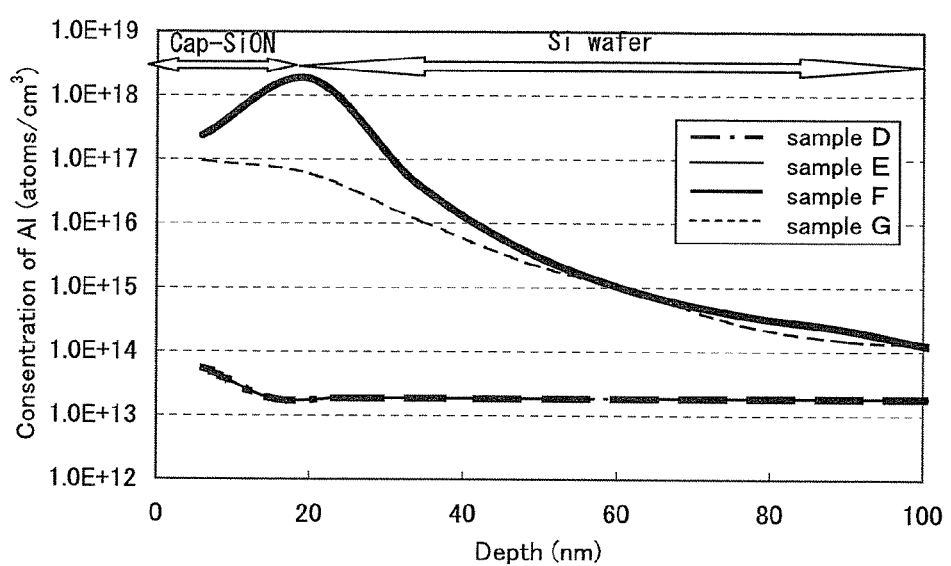
FIG. 15 is a graph showing results of analyses by secondary ion mass spectrometry.

FIG. 15 shows results of measurement of Samples D to G by SIMS. In FIG. 15, the horizontal axis shows the depth direction (nm) of the samples, while the vertical axis shows the concentration of Al (atoms/cm$^3$). Note that the silicon oxynitride film has a depth of about 20 nm. The film from the surface to a depth of approximately 20 nm is the silicon oxynitride film.

In FIG. 15, when the concentrations of Al in the single crystal silicon substrates (at a depth of 30 nm) were focused, the concentration of Al in Sample F was about $1\times10^{18}$ atoms/cm$^3$, while the concentration of Al in Sample E was about $1\times10^{14}$ atoms/cm$^3$ (measurement limit or less of the SIMS), which was the same or substantially the same as that in Sample D. Further, it is found that the concentrations of Al in Sample F and Sample E are 3 or more digits different from each other.

It was found that from FIG. 15 that Al having a concentration of $2\times10^{18}$ atoms/cm$^3$ was detected from the outermost surface of Sample F on which etching was performed with a substrate bias applied. Note that it is considered that since Al enters the single crystal silicon substrate by collision of ions in the SIMS, the tail of the profile extends in a depth direction as compared to the actual distribution. However, more Al was detected from Sample F on which etching was performed with a substrate bias applied than from Sample D on which etching was not performed. Further, from the result of Sample G, it was found that that Al on the outermost surface could be slightly removed by performing cycle cleaning after etching with a substrate bias applied; however, at a depth of 20 nm to 80 nm from the Si surface, the concentration of Al in Sample G was the same or substantially the same as that of Sample F regardless of whether or not cycle cleaning was performed. It is considered from the result that due to etching with a substrate bias applied, impurities (Al) are introduced to a depth at which the impurities (Al) cannot be removed by cycle cleaning.

From the result, it was found that a single crystal silicon layer can be restrained from being contaminated due to impurities by etching with no substrate bias applied. By using such a single crystal silicon layer, deterioration in device characteristics, such as defects in withstand voltage, due to impurity contamination can be prevented, so that a favorable semiconductor device can be manufactured.

EXAMPLE 2

In this example, in order to obtain information on impurities (here, Al) in a single crystal silicon substrate more accurately, results obtained by analysis using secondary ion mass spectrometry (SIMS) from a substrate side of a sample will be described.

Samples which were used in this example will be described. As Sample H, a single crystal silicon substrate was prepared on which etching was performed using an ICP etching apparatus with a substrate bias applied under the following conditions: the flow rate of a chlorine gas: 100 sccm, the reaction pressure: 1.5 Pa, the temperature of the lower electrode: 70° C., the RF (13.56 MHz) power which is supplied to a coil-electrode: 1000 W, and the power which is supplied to a lower electrode (on the bias side): 50 W.

Next, as Sample I, a single crystal silicon substrate was prepared on which etching was performed using an ICP etching apparatus with no substrate bias applied under the following conditions: the flow rate of a chlorine gas: 100 sccm, the reaction pressure: 2.0 Pa, the temperature of the lower electrode: 70° C., the RF (13.56 MHz) power which is supplied to a coil-electrode: 2000 W, and the power which is supplied to a lower electrode (on the bias side): 0W.

Next, As Sample J, a single crystal silicon substrate was prepared on which etching was performed using an ICP etching apparatus with no substrate bias applied under the following conditions: the flow ratio of a reaction gas: $NF_3$: $N_2$=20: 80 (sccm), the reaction pressure: 0.67 Pa, the temperature of the lower electrode: 40° C., the RF (13.56 MHz) power which is supplied to a coil-electrode: 2000 W, and the power which is supplied to a lower electrode (on the bias side): 0W.

Next, As Sample K, a single crystal silicon substrate was prepared on which no treatment was performed.

Note that in SIMS, absorbed impurities from an outer atmosphere were detected on the outermost surfaces of the samples. Therefore, a silicon oxynitride film was deposited to a thickness of 20 nm in order to protect each surface of Samples H to K.

Figure 16:
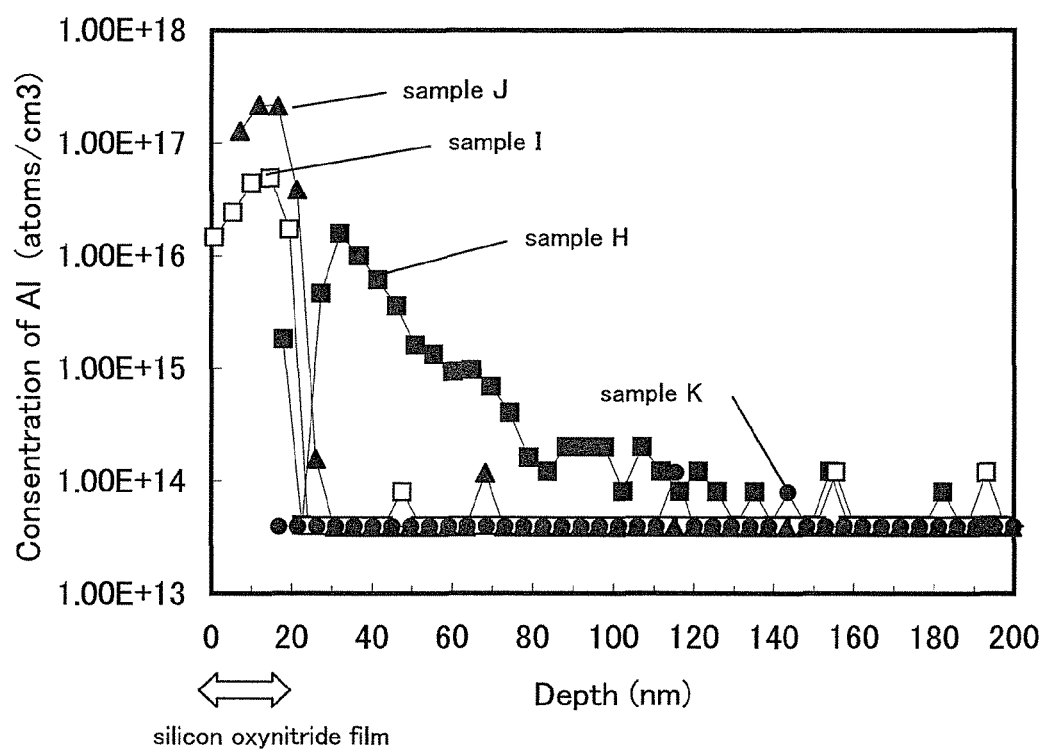
FIG. 16 is a graph showing results of analyses by secondary ion mass spectrometry.

FIG. 16 shows results of measuring Samples H to K by SIMS. In FIG. 16, the horizontal axis shows the depth direction (nm) of the samples, while the vertical axis shows the concentration of Al (atoms/cm$^3$). Note that the film from the surface to a depth of approximately 20 nm is the silicon oxynitride film. Note that here, the measurement was performed from the back surface of the single crystal silicon substrate in order to prevent effects of detecting components in the silicon oxynitride film on the single crystal silicon substrate as much as possible. After the single crystal silicon substrate was polished to a predetermined thickness, the measurement was performed from the back surface of the single crystal silicon substrate.

As shown in FIG. 16, the concentration of Al in Samples I and J on which etching was performed with no substrate bias applied is lower than that in Sample H on which etching was performed with a substrate bias applied, and Al was hardly detected in the single crystal silicon substrates of Samples I and J.

EXAMPLE 3

In this example, results of examination on an effect of contamination of a single crystal semiconductor layer, which is generated in manufacturing an SOI substrate depending on whether or not a substrate bias is applied will be described.

Hereinafter, a method for manufacturing an SOI substrate of this example will be described.

First, a single crystal semiconductor substrate was prepared and subjected to thermal oxidation treatment, so that a silicon oxide film serving as an insulating layer was formed. The temperature of the thermal oxidation treatment was 950° C., and the thickness of the insulating layer was 100 nm. In addition, an atmosphere including HCl at 3 vol % with respect to oxygen was used as the atmosphere of the thermal oxidation treatment.

In this example, a single crystal silicon wafer was used as the single crystal semiconductor substrate, and a single crystal silicon layer was formed over a base substrate. The single crystal silicon wafer is a square substrate having 5 inches on each side. In addition, the crystal orientation on its main surface is (100) and the crystal orientation on its side surface is <110>, and the conductivity of the single crystal silicon wafer is p-type.

After the thermal oxidation treatment of the single crystal semiconductor substrate, irradiation with hydrogen ions was performed with an ion doping apparatus in order to form an embrittled region in the single crystal semiconductor substrate. 50 sccm of a 100% hydrogen gas was used as a source gas, and the single crystal semiconductor substrate was irradiated with ions in plasma generated by excitation of the hydrogen gas which were accelerated by an electric field without mass separation. Accordingly, the embrittled region was formed. When the hydrogen gas was excited with the ion doping apparatus, three kinds of ion species ($H^+$, $H_2^+$, $H_3^+$) were generated, and approximately 70% of the hydrogen ion species that were generated from the hydrogen gas was $H_3^+$. Conditions of hydrogen ion doping were such that the acceleration voltage was 50 kV, the beam current density was 5 $\mu A/cm^2$, and the dose was $2.0 \times 10^{16}$ ions/cm$^2$.

Next, the base substrate and the single crystal semiconductor substrate were subjected to megasonic cleaning, and then subjected to cleaning in pure water containing ozone. Then, a surface of the base substrate and an insulating layer formed on the single crystal semiconductor substrate were disposed in close contact so as to be bonded to each other. In this example, a non-alkali glass substrate (product name: AN100) was used as the base substrate. The AN100 is a glass substrate having physical properties of a specific gravity of 2.51 g/cm$^3$, a Poisson's ratio of 0.22, a Young's modulus of 77 GPa, a two-axes elastic coefficient of 98.7 GPa, and a coefficient of thermal expansion of $38 \times 10^{-7}$/° C.

Next, heat treatment was performed at 200° C. for 2 hours in a heating furnace to increase the bonding strength between the base substrate and the silicon oxide film. Then, heat treatment was performed at 600° C. for 2 hours in a heating furnace, so that the single crystal semiconductor substrate was separated using the embrittled region as a boundary. Thus, a single crystal semiconductor layer was formed over the base substrate with the insulating layer interposed therebetween. The thickness of the single crystal semiconductor layer was approximately 140 nm.

Next, first etching, laser irradiation treatment, and second etching were performed on the single crystal semiconductor layer. Specific conditions will be described below.

As case will be described in which the first etching and the second etching were performed with no substrate bias applied as Condition 1. The first etching was performed on the single crystal semiconductor layer using a plasma CVD apparatus under the following conditions: the flow ratio of a reaction gas: $NF_3$: $N_2$=5:300 (sccm), the pressure in the process chamber: 50 Pa, the distance between electrodes: 30 mm, the temperature of the substrate: 200° C., and the RF (13.56 MHz) power: 50 W, whereby the thickness of the single crystal semiconductor layer was about 120 nm. Next, after irradiating the single crystal semiconductor layer with laser light, the second etching was performed under the same conditions as the first etching performed under Condition 1, whereby the thickness of the single crystal semiconductor layer was about 60 nm.

A case will be described in which the first etching was performed with a substrate bias applied and the second etching was performed with no substrate bias applied as Condition 2. The first etching was performed on a single crystal semiconductor layer using an ICP etching apparatus under the following conditions: the flow rate of a chlorine gas: 100 sccm, the reaction pressure: 1.5 Pa, the temperature of the lower electrode: 40° C., the RF (13.56 MHz) power which is supplied to a coil-electrode: 1000 W, and the power which is supplied to a lower electrode (on the bias side): 50 W, whereby the thickness of the single crystal semiconductor layer was about 120 nm. Next, after irradiation of the single crystal semiconductor layer with laser light, the second etching was performed under the same conditions as those of the first etching performed under Condition 1, whereby the thickness of the single crystal semiconductor layer was about 60 nm.

A case will be described in which the first etching was performed with no substrate bias applied and the second etching was performed with a substrate bias applied as Condition 3. The first etching was performed on a single crystal semiconductor layer under the same conditions as those of the first etching performed under Condition 1, whereby the thickness of the single crystal semiconductor layer was about 120 nm. Next, after irradiation of the single crystal semiconductor layer with laser light, the second etching was performed under the same conditions as those of the first etching treatment performed under Condition 2, whereby the thickness of the single crystal semiconductor layer was about 60 nm.

A case will be described in which the first etching and the second etching were performed with a substrate bias applied as Condition 4. The first etching was performed on a single crystal semiconductor layer under the same conditions as those of the first etching performed under Condition 2, whereby the thickness of the single crystal semiconductor layer was about 120 nm. Next, after irradiation of the single crystal semiconductor layer with laser light, the second etching was performed under the same conditions as those of the first etching performed under Condition 2, whereby the thickness of the single crystal semiconductor layer was about 60 nm.

Note that in Conditions 1 to 4, laser irradiation conditions were as follows: as a laser, a XeCl excimer laser which emits a beam having a wavelength of 308 nm was used and the laser beam was condensed by an optical system so that the beam shape on an irradiation surface was a linear shape of 390 µm×140 mm approximately. The pulse width of laser light was 20 nanoseconds, and the repetition rate was 30 Hz. The laser irradiation was performed while a nitrogen gas was sprayed on an irradiated region at a room temperature.

Figure 17A:
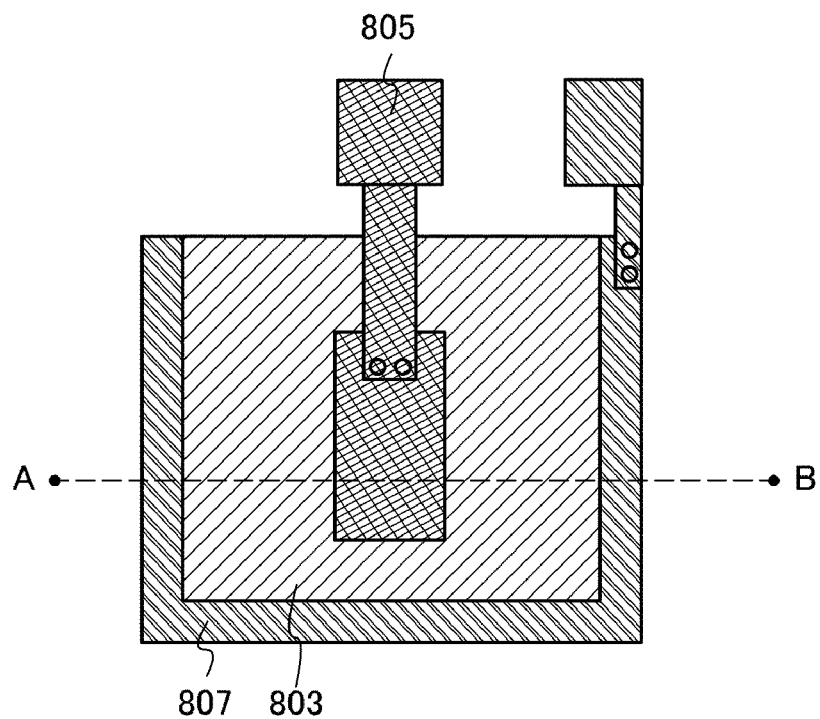
FIGS. 17A and 17B are views illustrating a capacitor TEG.
Figure 17B:
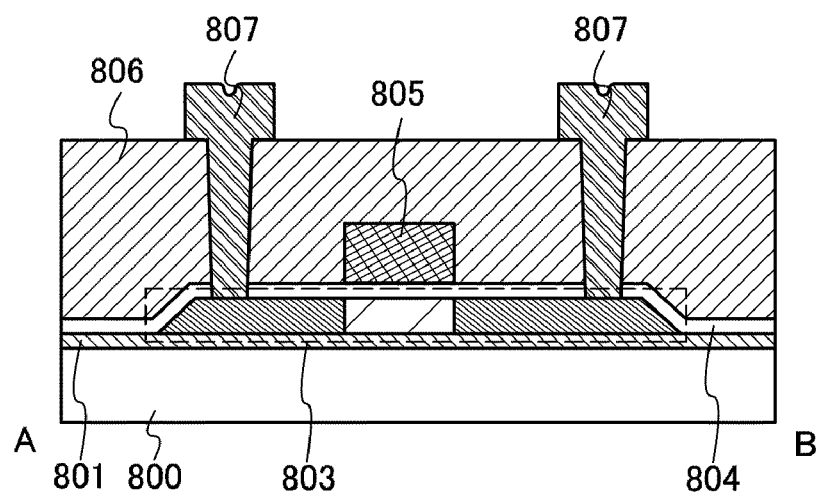
Figure 18A:
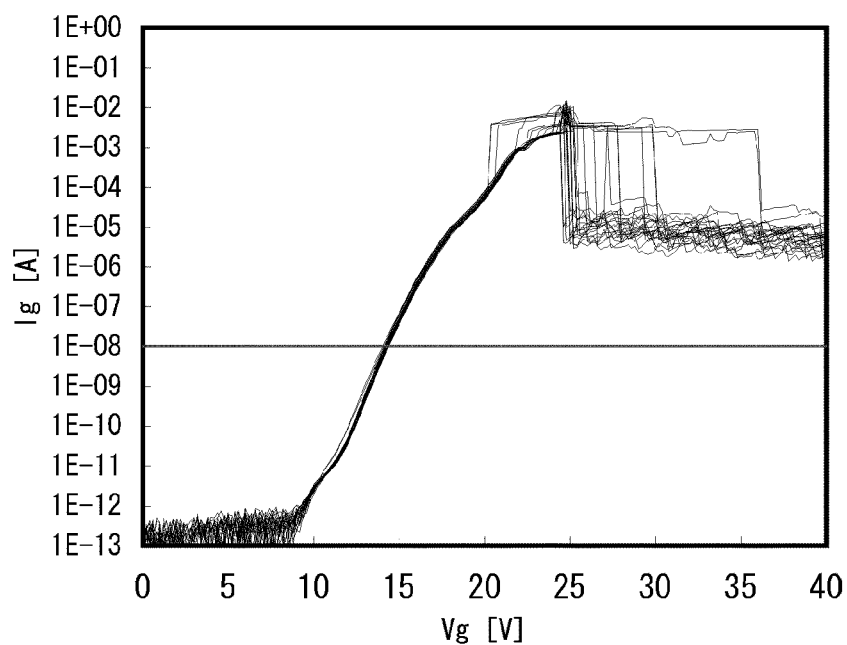
FIGS. 18A and 18B are graphs showing measurement results of the current-voltage (1-V) characteristics.
Figure 18B:
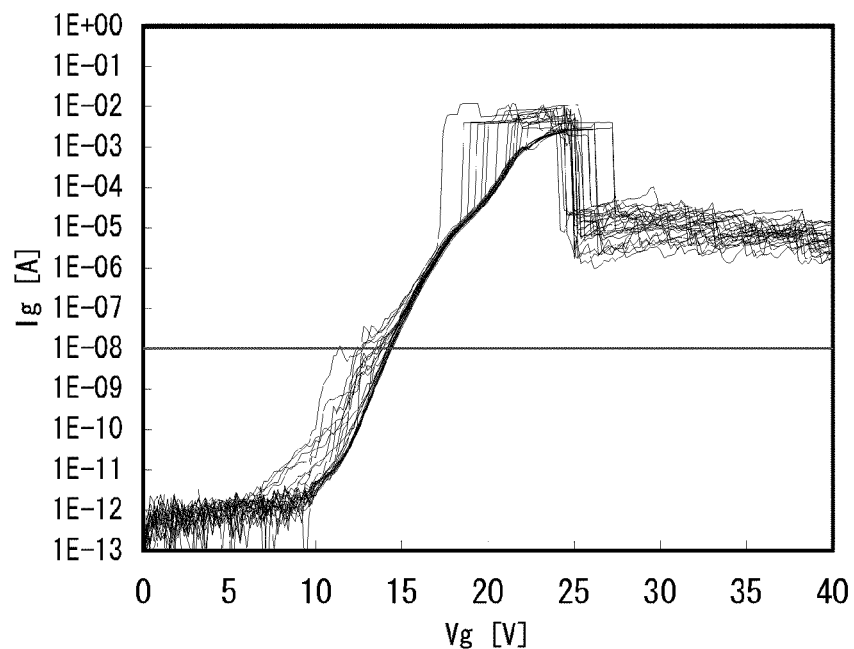
Figure 19A:
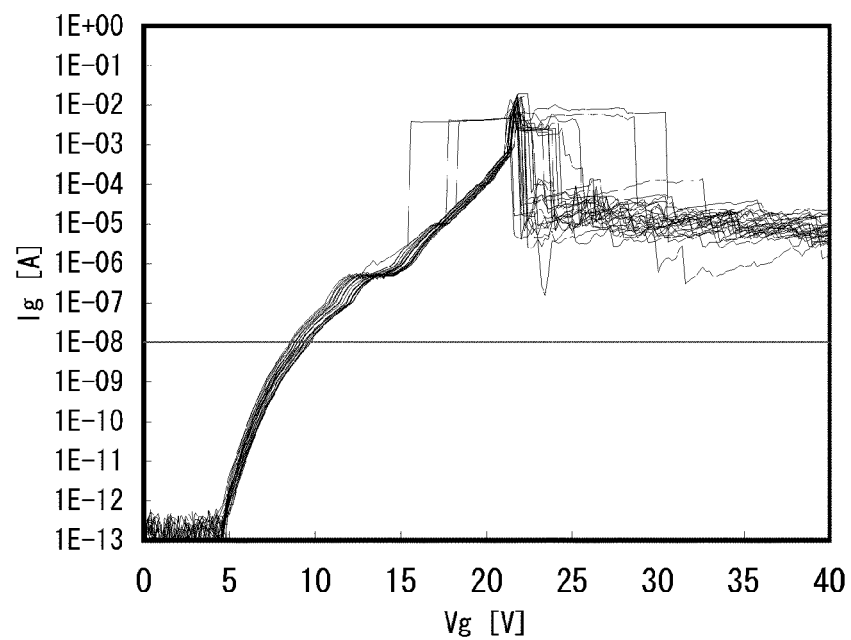
FIGS. 19A and 19B are graphs showing measurement results of the current-voltage (1-V) characteristics.
Figure 19B:
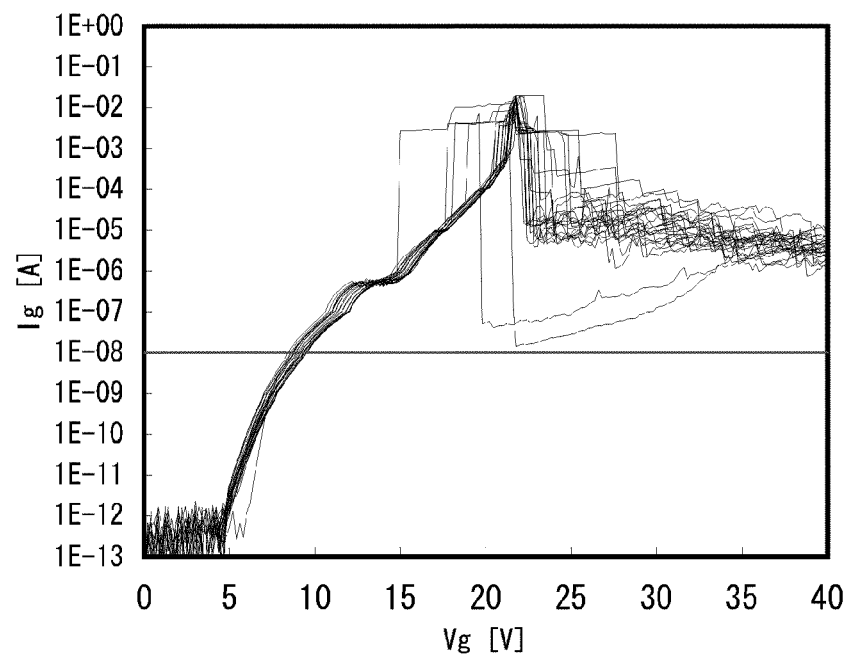

A capacitor TEG was manufactured using an SOI substrate manufactured under each of Conditions 1 to 4. FIGS. 17A and 17B illustrate a structure of the thin film transistor manufactured in this example. FIG. 17A is a top view of a capacitor TEG and FIG. 17B illustrates a cross section taken along line A-B of FIG. 17A.

A silicon oxide film 801 (having a thickness of 100 nm) formed by an oxidation treatment was formed over a glass substrate 800. In addition, a gate insulating layer 804 (having a thickness of 20 nm) was formed over the silicon oxide film 801, and a gate electrode layer 805 (a stack of a tantalum nitride layer having a thickness of 30 nm and a tungsten layer having a thickness of 370 nm) was formed over the gate insulating layer. In the silicon oxide film 801, a source and drain electrode layers 807 (a stack of a titanium layer having a thickness of 60 nm, a titanium nitride layer having a thickness of 40 nm, an aluminum layer having a thickness of 300 nm, and a titanium layer having a thickness of 100 nm in this order) which were connected to a source and drain regions 803 (impurity regions containing phosphorus as an impurity element imparting n-type conductivity) were formed. In addition, the source and drain electrode layers 807 (a stack of a titanium layer having a thickness of 60 nm, a titanium nitride layer having a thickness of 40 nm, an aluminum layer having a thickness of 300 nm, and a titanium layer having a thickness of 100 nm in this order) which were connected to a source region and a drain region (impurity regions containing boron as an impurity element imparting p-type conductivity) of the oxide silicon film 801 were formed. Further, an interlayer insulating layer 806 (a stack of a silicon oxide film having a thickness of 50 nm, a silicon nitride oxide film having a thickness of 300 nm, and a silicon oxynitride film having a thickness of 450 nm in this order) was formed over the thin film transistor. The capacitor TEG according to this example was formed so that the area of the gate electrode was 0.66 mm$^2$ FIGS. 18A and 18B and FIGS. 19A and 19B show results obtained by measuring the current-voltage (I–V) characteristics of Samples L to O. In FIGS. 18A and 18B and FIGS. 19A and 19B, the horizontal axis represents gate voltage Vg (V) and the vertical axis represents gate current Ig (A). Here, results obtained by measuring I–V characteristics at 25 points on each substrate surface of Samples L to O are shown.

From the results of FIGS. 18A and 18B and FIGS. 19A and 19B, it was found that in Sample L on which the first etching and the second etching were performed with no substrate bias applied, the rise of a current value thereof was late, there were few variations, and the withstand voltage thereof was favorable. Further, also in Sample M on which the first etching was performed with a substrate bias applied and the second etching was performed with no substrate bias applied, although variation in rise of a current value thereof is caused, the rise of a current value was late and favorable characteristics were obtained. On the other hand, it was found that in Sample N on which the first etching was performed with no substrate bias applied and the second etching was performed with a substrate bias applied and Sample O on which the first etching and the second etching were performed with a substrate bias applied, the rise of a current value thereof was early and the withstand voltage thereof was poor.

Figures 20A, 20B:
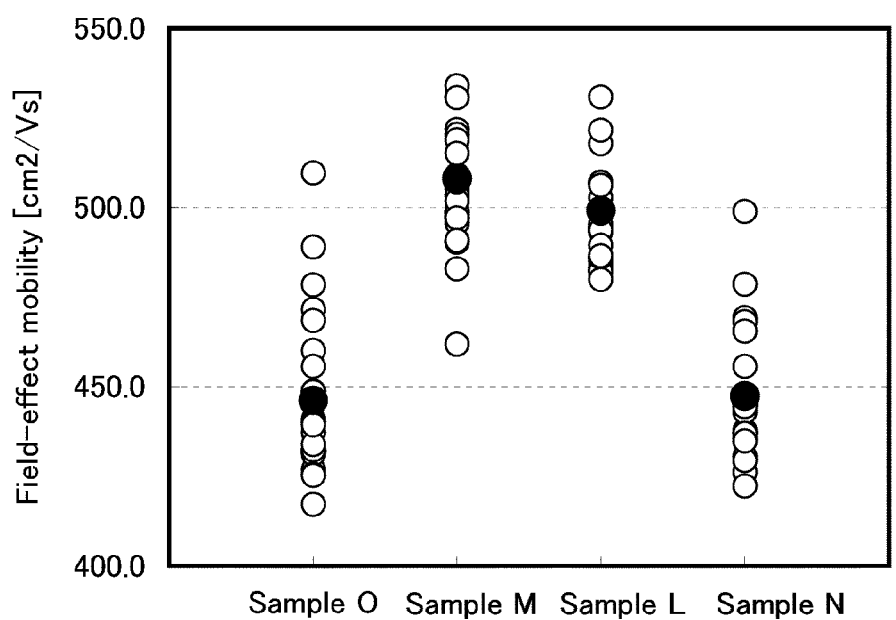
FIG. 20A and FIG. 20B are a graph and a table, respectively, showing measurement results of field-effect mobilities.

FIGS. 20A and 20B show results of field-effect mobilities of Samples L to O described above. From the results of the field-effect mobilities, it was found that in Sample L on which the first etching and the second etching were performed with no substrate bias applied and Sample M on which the first etching was performed with a substrate bias applied and the second etching was performed with no substrate bias applied, there was less variation and higher field-effect mobilities were obtained than in the other samples.

From the above results, it is considered that in Samples L and M on which at least the second etching was performed with no substrate bias applied, little contamination due to the etching treatment was caused and surface roughnesses of the single crystal silicon layers were reduced; therefore, favorable withstand voltages and high field-effect mobility were obtained. However, it is considered that in Samples N and O on which at least the second etching was performed with a substrate bias applied, contamination due to the etching treatment was caused and the surfaces of the single crystal silicon layers were roughened; therefore, the withstand voltages thereof were low and the field-effect mobilities thereof were reduced.

From the above results, it was found that according to one embodiment of the present invention, contamination of a single crystal silicon substrate which was generated in manufacturing an SOI substrate was reduced. Further, it was found that performance and reliability of a semiconductor device using such an SOI substrate were improved.

This application is based on Japanese Patent Application serial no. 2009-011425 filed with Japan Patent Office on Jan. 21, 2009, the entire contents of which are hereby incorporated by reference.

What is claimed is:

1. A method for manufacturing an SOI substrate comprising the steps of:
forming an oxide film on a single crystal semiconductor substrate;
introducing accelerated ions into the single crystal semiconductor substrate through the oxide film to form an embrittled region in the single crystal semiconductor substrate;
bonding a supporting substrate such that the supporting substrate and the single crystal semiconductor substrate face each other with the oxide film interposed therebetween;
forming a single crystal semiconductor layer bonded to the supporting substrate by heating the single crystal semiconductor substrate and performing separation at the embrittled region;
performing first etching on a surface of the single crystal semiconductor layer bonded to the supporting substrate with a substrate bias applied;
after performing the first etching, irradiating the single crystal semiconductor layer with a laser beam and melting and solidifying at least part of the surface of the single crystal semiconductor layer; and
after irradiating the single crystal semiconductor layer, performing second etching on the surface of the single crystal semiconductor layer with no substrate bias applied.

2. The method for manufacturing an SOI substrate according to claim 1, wherein the first etching is performed using a chlorine-based gas.

3. The method for manufacturing an SOI substrate according to claim 1, wherein the second etching is performed using a fluorine-based gas.

4. The method for manufacturing an SOI substrate according to claim 1, wherein the first etching and the second etching are performed using a fluorine-based gas.

5. The method for manufacturing an SOI substrate according to claim 1, wherein the supporting substrate is a glass substrate.

6. A method for manufacturing a semiconductor device using an SOI substrate manufactured by the manufacturing method according to claim 1,
wherein a semiconductor element comprising the single crystal semiconductor layer over the supporting substrate is manufactured, and
wherein the single crystal semiconductor layer is etched by performing the second etching.

7. A method for manufacturing an SOI substrate comprising the steps of:
forming an oxide film on a single crystal semiconductor substrate;
introducing accelerated ions into the single crystal semiconductor substrate through the oxide film to form an embrittled region in the single crystal semiconductor substrate;
forming an insulating layer over a supporting substrate;
bonding the supporting substrate such that the supporting substrate and the single crystal semiconductor substrate face each other with the oxide film and the insulating layer interposed therebetween;
forming a single crystal semiconductor layer bonded to the supporting substrate by heating the single crystal semiconductor substrate and performing separation at the embrittled region;
performing first etching on a surface of the single crystal semiconductor layer bonded to the supporting substrate with a substrate bias applied;
after performing the first etching, irradiating the single crystal semiconductor layer with a laser beam and melting and solidifying at least part of the surface of the single crystal semiconductor layer; and
after irradiating the single crystal semiconductor layer, performing second etching on the surface of the single crystal semiconductor layer with no bias applied.

8. The method for manufacturing an SOI substrate according to claim 7, wherein the first etching is performed using a chlorine-based gas.

9. The method for manufacturing an SOI substrate according to claim 7, wherein the second etching is performed using a fluorine-based gas.

10. The method for manufacturing an SOI substrate according to claim 7, wherein the first etching and the second etching are performed using a fluorine-based gas.

11. The method for manufacturing an SOI substrate according to claim 7, wherein the supporting substrate is a glass substrate.

12. A method for manufacturing a semiconductor device using an SOI substrate manufactured by the manufacturing method according to claim 7,
wherein a semiconductor element comprising the single crystal semiconductor layer over the supporting substrate is manufactured, and
wherein the single crystal semiconductor layer is etched by performing the second etching.

* * * * *